(12) United States Patent
Pak et al.

(10) Patent No.: US 7,709,868 B2
(45) Date of Patent: May 4, 2010

(54) LIGHT SENSING ELEMENT, ARRAY SUBSTRATE HAVING THE SAME AND LIQUID CRYSTAL DISPLAY APPARATUS HAVING THE SAME

(75) Inventors: Sang-Jin Pak, Yongin-si (KR); Hyung-Guel Kim, Yongin-si (KR); Kee-Han Uh, Yongin-si (KR); Jong-Whan Cho, Gunpo-si (KR); Jin Jeon, Seoul (KR); Young-Bae Jung, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 295 days.

(21) Appl. No.: 11/867,334

(22) Filed: Oct. 4, 2007

(65) Prior Publication Data

US 2008/0023735 A1  Jan. 31, 2008

Related U.S. Application Data

(62) Division of application No. 10/972,213, filed on Oct. 22, 2004, now Pat. No. 7,279,730.

(30) Foreign Application Priority Data

Oct. 23, 2003  (KR) ............... 2003-74317

(51) Int. Cl.
*H01L 31/113* (2006.01)
(52) U.S. Cl. .................. 257/290; 257/291; 257/431; 257/443; 257/448; 257/E31.053; 257/E31.073; 257/E31.111; 250/208.1; 348/294; 348/302; 348/307; 349/24; 349/41; 349/42; 349/43; 345/104

(58) Field of Classification Search .................. 257/290, 257/291, 431, 443, 448, E31.053, E33.073, 257/E31.111; 250/208.1, 208.4, 208.5, 208.6, 250/214.1; 348/281, 283, 294, 302, 303, 348/304, 307, 308, 309; 349/24, 28, 34, 349/41, 42, 43; 345/38, 50, 55, 92, 104
See application file for complete search history.

(56) References Cited

U.S. PATENT DOCUMENTS

| 6,995,743 B2 * | 2/2006 | Boer et al. .................. 345/104 |
| 2003/0156087 A1 | 8/2003 | Boer et al. |

* cited by examiner

*Primary Examiner*—Evan Pert
*Assistant Examiner*—Eduardo A Rodela
(74) *Attorney, Agent, or Firm*—Innovation Counsel LLP

(57) ABSTRACT

In a light sensing element having simplified structure, an array substrate having the light sensing element and an LCD apparatus having the light sensing element, the light sensing element includes a first electrode, a control electrode and a second electrode. An alternating bias voltage is applied to the first electrode. An off voltage is applied to the control electrode. The second electrode outputs a light-induced leakage current based on an externally provided light and the bias voltage. Therefore, the array substrate includes one light sensing switching element corresponding to one pixel so that structure of the array substrate is simplified and opening ratio is increased.

7 Claims, 24 Drawing Sheets

LIGHT SENSING ELEMENT, ARRAY SUBSTRATE HAVING THE SAME AND LIQUID CRYSTAL DISPLAY APPARATUS HAVING THE SAME

RELATED APPLICATIONS

This is a divisional of U.S. patent application Ser. No. 10/972,213, filed Oct. 22, 2004, now U.S. Pat. No. 7,279,730, issued Oct. 9, 2007. It is an accurate translation and claims priority of Korean Patent Application No. 2003-74317, filed Oct. 23, 2003, the entire disclosure of which is incorporated herein by reference.

BACKGROUND

This disclosure relates to light sensing elements, an array substrate having the light sensing elements, and liquid crystal displays (LCDs) having the light sensing elements. More particularly, this disclosure relates to light sensing elements having simple structures and improved opening ratios, array substrates incorporating the light sensing elements, and LCDs incorporating the light sensing element arrays.

In general, light sensing elements sense light provided from an external source to an electronic apparatus so as to sense the position on the apparatus at which the light is incident. A liquid crystal display (LCD) apparatus having such a light sensing element is disclosed in 56.3 Society for Information Display (SID) by Willem den Boer et al., entitled "Active Matrix LCD with Integrated Optical Touch Screen." A plurality of light sensing elements is arranged in a matrix shape in the display so as to generate positional information corresponding to the position of an externally provided light on the display. The light sensing elements may sense, for example, a fingerprint. Also, a touch panel may include the light sending elements.

The LCD panel includes the light sensing elements so as to sense the light. The light sensing elements may be formed on an array substrate of the LCD panel. Since, the space occupied by the pixel region of an LCD array substrate is relatively large, there may not be sufficient space available on the array substrate for the light sensing elements. Thus, when the light sensing element is included in either a transmissive or a reflective LCD, the opening ratio of the LCD is decreased. In addition, a number of elements formed in one pixel region of the array substrate is increased so that the structure of the array substrate is complicated, thereby decreasing a yield of the LCD apparatus. Furthermore, a signal interference may be generated between the elements in the pixel region.

The present disclosure is directed to overcoming the above and other problems and disadvantages of the prior art.

BRIEF SUMMARY

In accordance with the present disclosure, light sensing elements for LCDs are provided that have simple structures and improved opening ratios, together with array substrates incorporating the light sensing elements and LCDs incorporating the light sensing element arrays.

A light sensing element in accordance with one embodiment of the present disclosure includes a first electrode, a control electrode and a second electrode. An alternating bias voltage is applied to the first electrode. An off voltage is applied to the control electrode. The second electrode outputs a light-induced leakage current based on an externally provided light and the bias voltage.

A light sensing element in accordance with another feature of the present disclosure includes a first electrode, a control electrode and a second electrode. An alternating bias voltage is applied to the first electrode. The second electrode is electrically connected to the control electrode, and outputs a light-induced leakage current based on an externally provided light and the bias voltage.

A light sensing element in accordance with still another feature of the present disclosure includes a first electrode, a control electrode and a second electrode. An alternating bias voltage is applied to the first electrode. The control electrode is electrically connected to the first electrode. The second electrode outputs a light-induced leakage current based on an externally provided light and the bias voltage.

An array substrate in accordance with a feature of the present disclosure includes a transparent substrate, a plurality of gate lines, a plurality of data lines, a switching element, a plurality of read out lines and a light sensing element. A gate signal is transmitted through the gate lines disposed on the transparent substrate. A data signal is transmitted through the data lines disposed on the transparent substrate. The switching element is formed in a region defined by the gate and data lines. A gate electrode of the switching element is electrically connected to one of the gate lines, and a source electrode of the switching element is electrically connected to one of the data lines. The light sensing element is formed in a region defined by the gate, data and read out lines. The light sensing element includes a first electrode receiving an alternating bias voltage, a control electrode receiving an off voltage, and a second electrode. The second electrode outputs a light-induced leakage current to one of the read out lines based on an externally provided light and the bias voltage. The read out lines are disposed on the transparent substrate.

An array substrate in accordance with another feature of the present disclosure includes a transparent substrate, a plurality of gate lines, a plurality of data lines, a switching element, a plurality of read out lines and a light sensing element. A gate signal is transmitted through the gate lines disposed on the transparent substrate. A data signal is transmitted through the data lines disposed on the transparent substrate. The switching element is formed in a region defined by the gate and data lines. A gate electrode of the switching element is electrically connected to one of the gate lines, and a source electrode of the switching element is electrically connected to one of the data lines. The light sensing element is formed in a region defined by the gate, data and read out lines. The light sensing element includes a first electrode receiving an alternating bias voltage, a control electrode and a second electrode electrically connected to the control electrode. The second electrode outputs a light-induced leakage current to one of the read out lines based on an externally provided light and the bias voltage. The read out lines are disposed on the transparent substrate.

An array substrate in accordance with still another feature of the present disclosure includes a transparent substrate, a plurality of gate lines, a plurality of data lines, a switching element, a plurality of read out lines and a light sensing element. A gate signal is transmitted through the gate lines disposed on the transparent substrate. A data signal is transmitted through the data lines disposed on the transparent substrate. The switching element is formed in a region defined by the gate and data lines. A gate electrode of the switching element is electrically connected to one of the gate lines, and a source electrode of the switching element is electrically connected to one of the data lines. The light sensing element is formed in a region defined by the gate, data and read out lines. The light sensing element includes a first electrode receiving an alternating bias voltage, a control electrode electrically connected to the first electrode and a second electrode. The second electrode outputs a light-induced leakage current to one of the read out lines based on an externally provided light and the bias voltage. The read out lines are disposed on the transparent substrate.

An LCD apparatus in accordance with a feature of the present disclosure includes an upper substrate, a lower substrate corresponding to the upper substrate and a liquid crystal layer. The lower substrate includes a light sensing element formed in a region defined by gate lines, data lines and read out lines. The light sensing element has a first electrode receiving an alternating bias voltage, a control electrode receiving an off voltage and a second electrode outputting a light-induced leakage current to one of the read out lines based on an externally provided light and the bias voltage. The liquid crystal layer is interposed between the upper and lower substrates.

An LCD apparatus in accordance with another feature of the present disclosure includes an upper substrate, a lower substrate corresponding to the upper substrate and a liquid crystal layer. The lower substrate includes a light sensing element formed in a region defined by gate lines, data lines and read out lines. The light sensing element has a first electrode receiving an alternating bias voltage, a control electrode and a second electrode electrically connected to the control electrode. The second electrode outputs a light-induced leakage current to one of the read out lines based on an externally provided light and the bias voltage. The liquid crystal layer is interposed between the upper and lower substrates.

An LCD apparatus in accordance with still another feature of the present disclosure includes an upper substrate, a lower substrate corresponding to the upper substrate and a liquid crystal layer. The lower substrate includes a light sensing element formed in a region defined by gate lines, data lines and read out lines. The light sensing element has a first electrode receiving an alternating bias voltage, a control electrode electrically connected to the first electrode and a second electrode.

The second electrode outputs a light-induced leakage current to one of the read out line based on an externally provided light and the bias voltage. The liquid crystal layer is interposed between the upper and lower substrates. The bias voltage alternates between a first level and a second level that is different from the first level. The second level may have an identical polarity or an opposite polarity to the first level. Therefore, the LCD panel includes one light sensing thin film transistor (TFT) corresponding to one pixel so that structure of the LCD panel is simplified and opening ratio is increased.

A better understanding of the above and many other features and advantages of the LCD light sensing elements of this disclosure may be obtained from a consideration of the detailed description thereof below, particularly if such consideration is made in conjunction with the several views of the appended drawings, wherein like elements are referred to by like reference numerals throughout.

DETAILED DESCRIPTION

Figure 1:
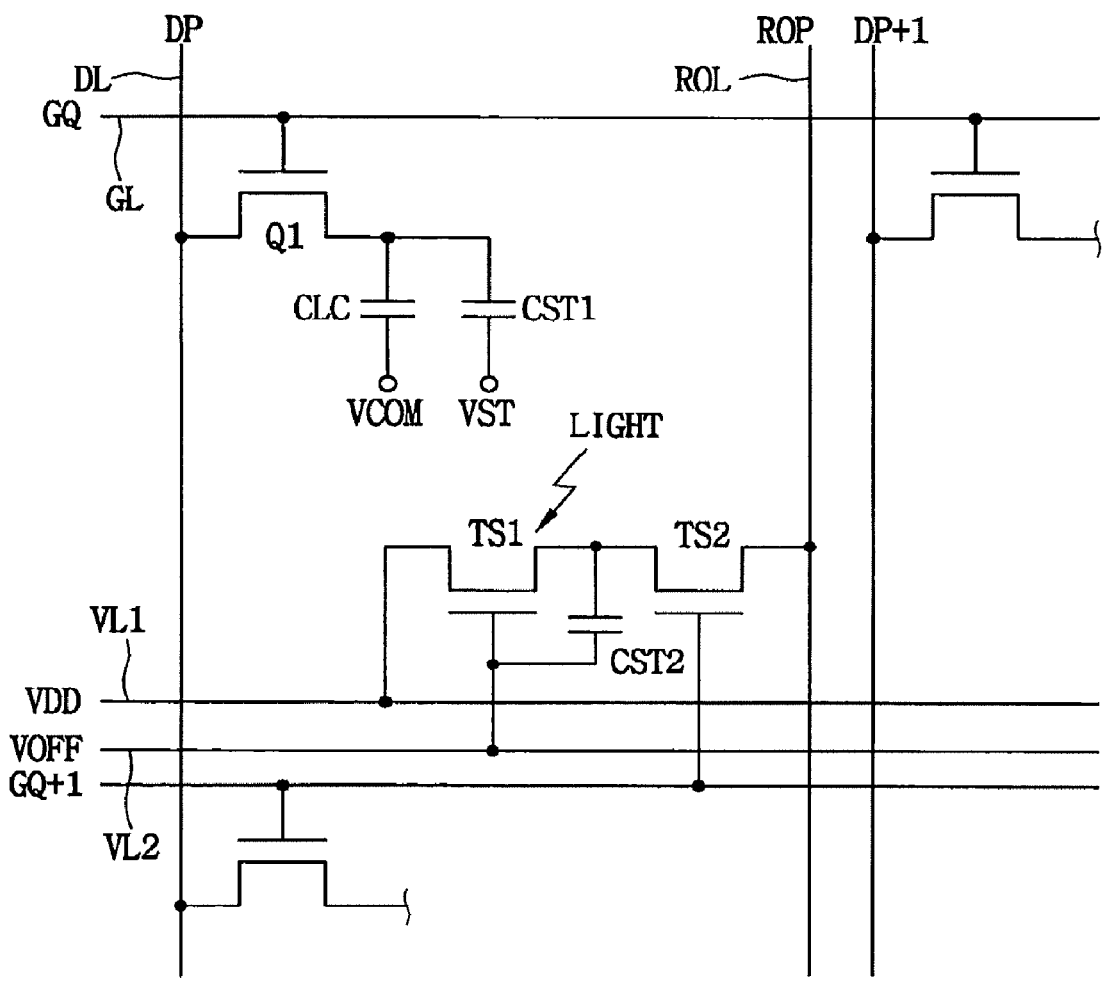
FIG. 1 is a circuit diagram showing a light sensing element of an array substrate in accordance with an exemplary embodiment of the present disclosure.

FIG. 1 is a circuit diagram showing a light sensing element of an LCD panel in accordance with an exemplary embodiment of the present disclosure. The light sensing element is disposed in a pixel region of the LCD panel. In FIG. 1, the LCD panel includes a gate line GL, a data line DL, a first switching element Q1 electrically connected to the gate and data lines GL and DL, a liquid crystal capacitor CLC electrically connected to the first switching element Q1 and a first storage capacitor CST1. The LCD panel may include a plurality of the gate lines GL, a plurality of the data lines DL, a plurality of the first switching elements Q1, a plurality of the liquid crystal capacitors CLC and a plurality of the first storage capacitors CST1.

The LCD panel further includes a first power supply line VL1, a second power supply line VL2, a second switching element TSI that senses an amount of an externally provided light to form a current based on the externally provided light, a second storage capacitor CST2 that stores an electric charge formed by the current that is applied from the second switching element TS1 to the second storage capacitor CST2, a third switching element TS2 that outputs the stored electric charge that is stored in the second storage capacitor CST2 and a read out line ROL. The LCD panel may also include a plurality of the first power supply lines VL1, a plurality of the second power supply lines VL2, a plurality of the second switching elements TSI, a plurality of the second storage capacitors CST2, a plurality of the third switching elements TS2 and a plurality of the read out lines ROL. Each of the second switching elements TSI, each of the second storage capacitors CST2 and each of the third switching elements TS2 form a light sensing part.

The light sensing part functions as follows. Firstly, when the externally provided light is incident into the second switching element TS1, a negative voltage and a positive voltage are applied to a second power line VL2 and a first power line VL1, respectively, so that the second switching element TSI is turned off. The second power line VL2 and the first power line VLI are electrically connected to a gate electrode and a drain electrode of the second switching element TS1, respectively. A light-induced leakage current corresponding to the second switching element TS1 where the externally provided light is incident is greater than a light-induced leakage current corresponding to the third switching element TS2.

An electric charge formed by the light-induced leakage current is stored in the second storage capacitor CST2, whereas, the third switching element TS2 is turned off. The electric charge is stored in the second storage capacitor CST2 until the third switching element TS2 is turned on.

When a gate signal having a high level is applied to a next gate line GQ+1 that is electrically connected to the gate electrode of the third switching element TS2, the electric charge stored in the second storage capacitor CST2 is outputted to a read out circuit (not shown) through the third switching element TS2 and the read out line ROL.

In the present embodiment, the LCD panel includes the light sensing element so as to sense the light. The light sensing element may be formed on an array substrate of the LCD panel. However, two thin film transistors (TFT) for sensing the light and one capacitor are formed in one pixel region of the array substrate so that the structure of the array substrate may be complicated.

Figure 2:
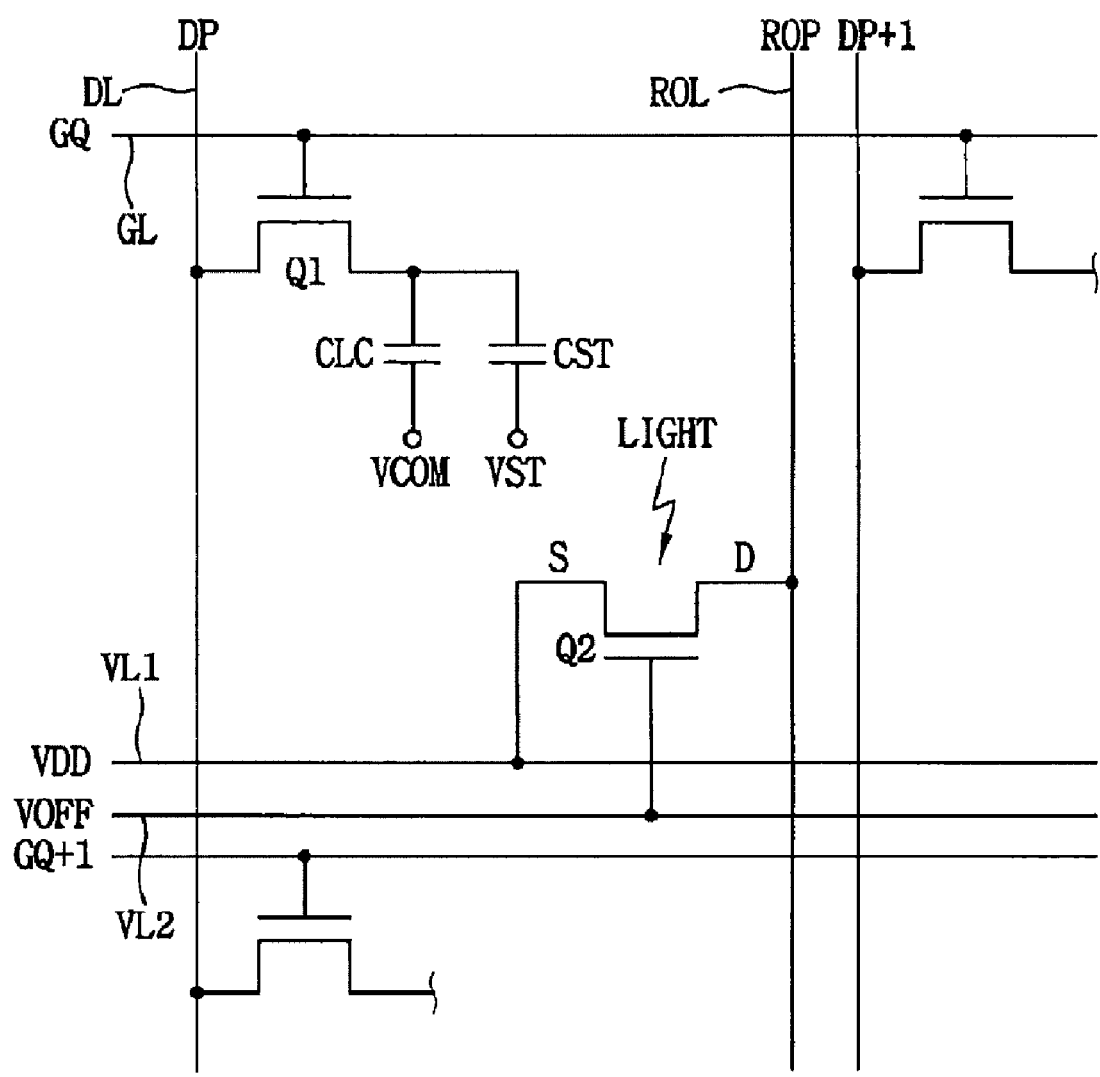
FIG. 2 is a plan view showing a light sensing element according to another exemplary embodiment of the present disclosure.

FIG. 2 is a plan view showing a light sensing element according to another exemplary embodiment of the present disclosure.

Referring to FIG. 2, an LCD apparatus having the light sensing element 20 includes a gate line GL, a data line DL, a first switching element Q1, a liquid crystal capacitor CLC, a storage capacitor CST, a first voltage line VLI, a second voltage line VL2, a second switching element Q2 and a read out line ROL. The LCD apparatus may include a plurality of the gate lines GL, a plurality of the data lines DL, a plurality of the first switching elements Q1, a plurality of the liquid crystal capacitors CLC, a plurality of the storage capacitors CST, a plurality of the first voltage lines VL1, a plurality of the second voltage lines VL2, a plurality of the second switching elements Q2 and a plurality of the read out lines ROL.

The gate line GL is extended in a longitudinal direction with respect to the LCD apparatus, and a gate signal GQ is transmitted to the first switching element Q1 through the gate line GL. The data line DL is extended in a vertical direction with respect to the LCD apparatus, and a data signal DP is transmitted to the first switching element Q1 through the data line DL.

The first switching element Q1 is formed in a region defined by the adjacent gate and data lines GL and DL. A first source electrode of the first switching element Q1 is electrically connected to the data line DL, and a first gate electrode of the first switching element Q1 is electrically connected 'to the gate line GL. When the gate signal GQ having a high level is applied to the first switching element Q1 through the gate line GL, the first switching element Q1 outputs the data signal DP to the liquid crystal capacitor CLC and the storage capacitor CST through a first drain electrode of the first switching element Q1.

A first terminal of the liquid crystal capacitor CLC is electrically connected to the first drain electrode of the first switching element Q1, and a common voltage VCOM is applied to a second terminal of the liquid crystal capacitor CLC. The data signal DP outputted from the first drain electrode is stored in the liquid crystal capacitor CLC.

A first terminal of the storage capacitor CST is electrically connected to the first drain electrode of the first switching element Q1, and a storage voltage VST is applied to a second terminal of the storage capacitor CST. When the data signal DP outputted from the first drain electrode is stored in the storage capacitor CST and the first switching element Q1 is turned off, an electric charge stored in the liquid crystal capacitor CLC is discharged so that the stored electric charge is applied to the liquid crystal capacitor CLC.

The first voltage line VL1 is extended in the longitudinal direction to apply a first voltage to the second switching element Q2. The first voltage is provided from an exterior to the light sensing element. The second voltage line VL2 is extended in the longitudinal direction to apply a second voltage to the second switching element Q2. The second voltage may be provided from an exterior to the light sensing element. The first voltage may be a bias voltage VDD, and the second voltage may be an off level voltage VOFF. The off level voltage VOFF may be a minimum value of the bias voltage VDD.

The second switching element Q2 is formed in a region in which the first voltage line VLI transmitting the bias voltage VDD, the second voltage line VL2 transmitting the off level voltage VOFF and the read out line ROL are disposed adjacent to one another. A second source electrode of the second switching element Q2 is electrically connected to the first voltage line VL1, and a second gate electrode of the second switching element Q2 is electrically connected to the second voltage line VL2. When a light is incident into the second switching element Q2, a channel is formed between the second source electrode and a second drain electrode of the second switching element Q2 so that a light-induced leakage current flows into the read out line ROL through the second drain electrode of the second switching element Q2. The light-induced leakage current is a light sensing signal corresponding to a predetermined position.

The read out line ROL is extended in the vertical direction, and outputs the light sensing signal that is the light-induced leakage current from the second drain electrode of the second switching element Q2 into a driving integrated circuit (not shown).

When the off level voltage VOFF, the bias voltage VDD and the light are applied to the second gate electrode of the second switching element Q2, the second source electrode of the second switching element Q2 and the region between the second source electrode and the second drain electrode of the second switching element Q2, respectively, the light sensing signal is outputted to the read out line ROL through the second drain electrode of the second switching element Q2.

For example, when the light is not incident into the space between the second source electrode and the second drain electrode of the second switching element Q2, the light-induced leakage current may not flow between the second source electrode and the second drain electrode of the second switching element Q2 although the bias voltage VDD that alternates between about −7.5V and about +15V is applied to the second source electrode of the second switching element Q2.

When the light is incident into the space between the second source electrode 15 and the second drain electrode of the second switching element Q2 and the bias voltage VDD that alternates between about −7.5V and about +15V is applied to the second source electrode of the second switching element Q2, the light-induced leakage current flows between the second source electrode and the second drain electrode of the second switching element Q2 so that the light-induced leakage current flows through the read out line ROL, thereby forming the light sensing signal. A read out integrated circuit (not shown) electrically connected to an end portion of the read out line generates a position information based on the light sensing signal.

When the level of the light sensing signal is weak, an additional amplifier or a noise filter may be disposed between the read out line and the read out integrated circuit (not shown).

The first voltage line VL1, the second voltage line VL2, the second switching element Q2 and the read out line ROL may be formed on an additional plate to form a pattern recognition panel. The pattern recognition panel may sense a fingerprint. Also, a touch panel may include the pattern recognition panel.

Figure 3:
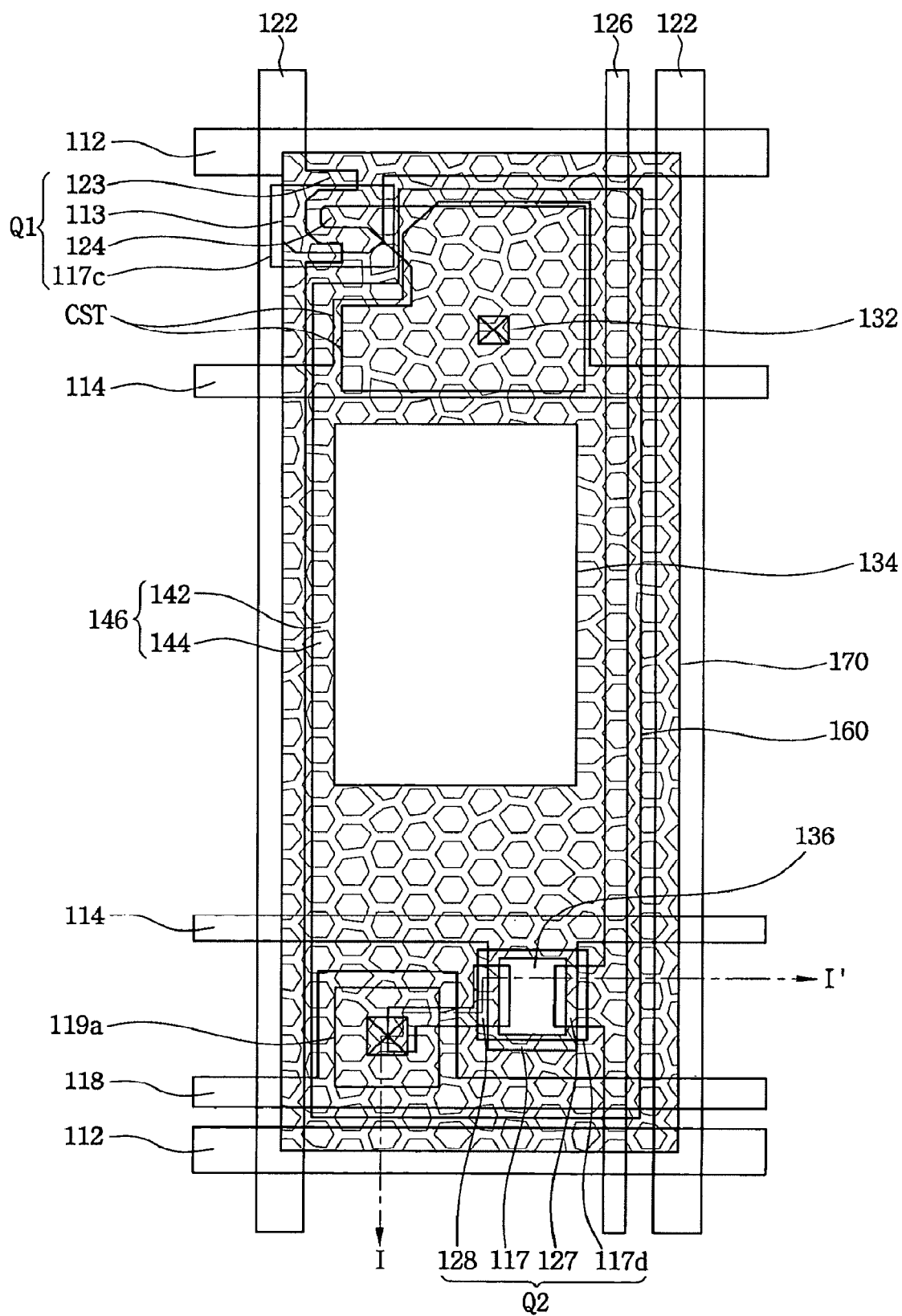
FIG. 3 is a plan view showing an array substrate according to another exemplary embodiment of the present disclosure.
Figure 4:
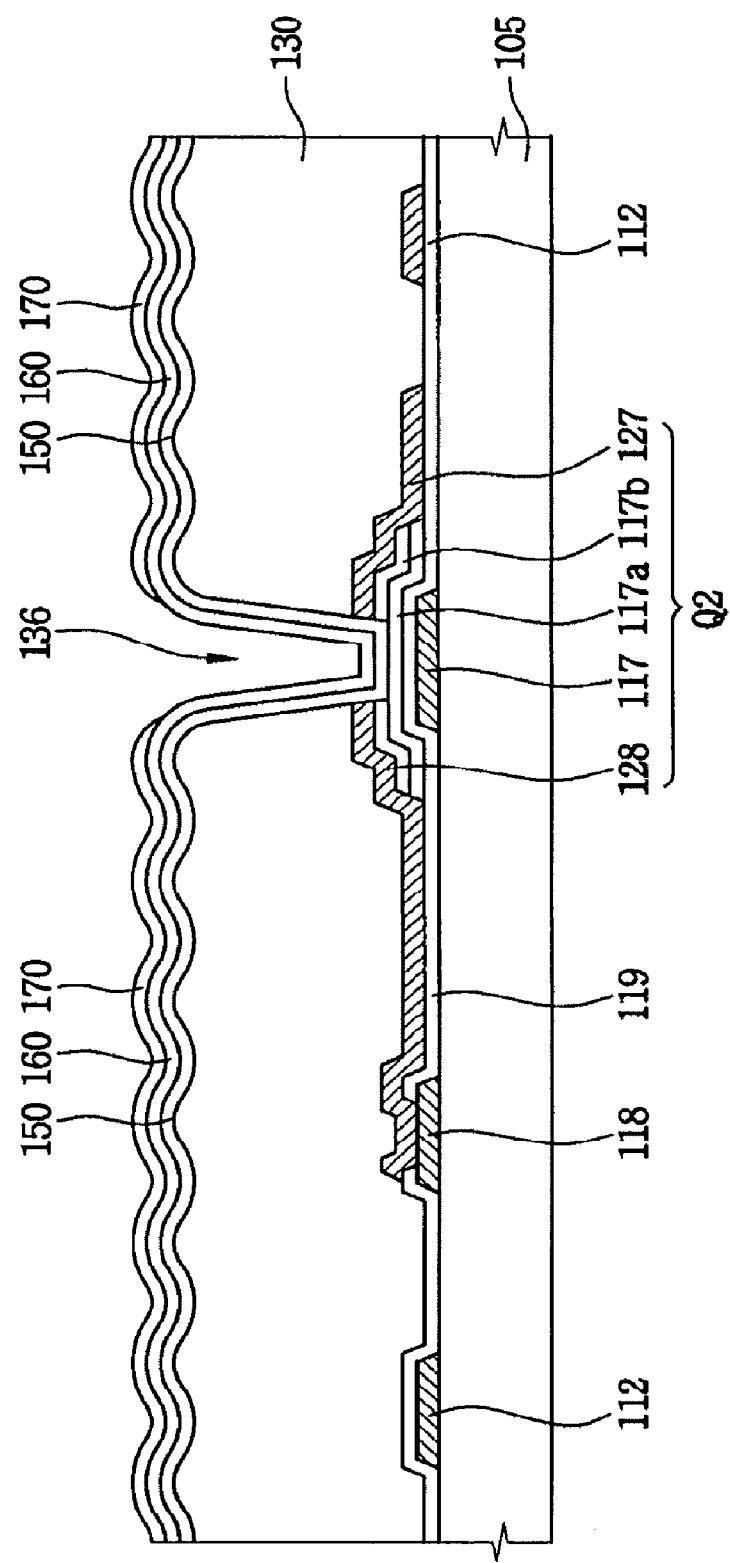
FIG. 4 is a cross-sectional view taken along the line I-I' of FIG. 3.

FIG. 3 is a plan view showing an array substrate according to another exemplary embodiment of the present disclosure, and FIG. 4 is a cross-sectional view taken along the line I-I' of FIG. 3.

Referring to FIGS. 3 and 4, the array substrate includes a transparent substrate 105, a gate line 112, a data line 122, a first switching element Q1, a storage capacitor CST, a first voltage line 114, a second switching element Q2, a read out line 126, a pixel electrode 160 and a reflection plate 170 defining a reflection region and an opening window 134. The array substrate may include a plurality of the gate lines 112, a plurality of the data lines 122, a plurality of the first switching elements Q1, a plurality of the storage capacitors CST, a plurality of the first voltage lines 114, a plurality of the second switching elements Q2, a plurality of the read out lines 126, a plurality of the pixel electrodes 160 and a plurality of the reflection plates 170.

The gate lines 112 are extended in a longitudinal direction, and arranged in a vertical direction. The data lines 122 are extended in the vertical direction, and arranged in the longitudinal direction. The gate and data lines 112 and 122 adjacent to one another define a plurality of regions.

Each of the gate lines 112 and each of the data lines 122 are disposed on a transparent substrate. The first switching element Q1 is formed in one of the regions defined by the gate and data lines 112 and 122. The first switching element Q1 includes a first gate electrode 113 electrically connected to the gate line 112, a first source electrode 123 electrically connected to the data line 122 and a first drain electrode 124 spaced apart from the first source electrode 123. The first gate electrode 113 is disposed between the first source electrode 123 and the first drain electrode 124, and electrically insulated from the first source electrode 123 and the first drain electrode 124.

The storage capacitor CST includes a first storage line 114 formed from a same layer with the gate line 112 and the first drain electrode 124 formed from a same layer with the data line 122.

A first voltage line 114 and a second voltage line 118 are disposed on the 10 transparent substrate. The first and second voltage lines 114 and 118 are extended in the longitudinal direction, and arranged in the vertical direction.

The read out line 126 is disposed on the transparent substrate. The read out line 126 is extended in substantially parallel with the data line 122, and arranged in the longitudinal direction.

The second switching element Q2 includes a second gate electrode electrically connected to the first voltage line 114, a second drain electrode electrically connected to the read out line 126 and a second source electrode spaced apart from the read out line 126.

The pixel electrode 160 comprises indium tin oxide (ITO), indium zinc oxide 20 (IZO), or the like. The pixel electrode 160 is disposed in the region defined by the gate and data lines 112 and 122 adjacent to one another. The pixel electrode 160 is electrically connected to the first drain electrode 124 through a first hole 132.

The reflection plate 170 is formed on the pixel electrode 160 to define the reflection region reflecting an externally provided light and an opening window 134.

An artificial light passes through the opening window 134. The reflection plate 170 includes a second hole 136 corresponding to the second switching element Q2 so that the externally provided light is incident into the 'space between the second source electrode and the second drain electrode.

FIGS. 5A to 5E are plan views showing a method of manufacturing an array 5 substrate according to another exemplary embodiment of the present disclosure.

Figure 5A:
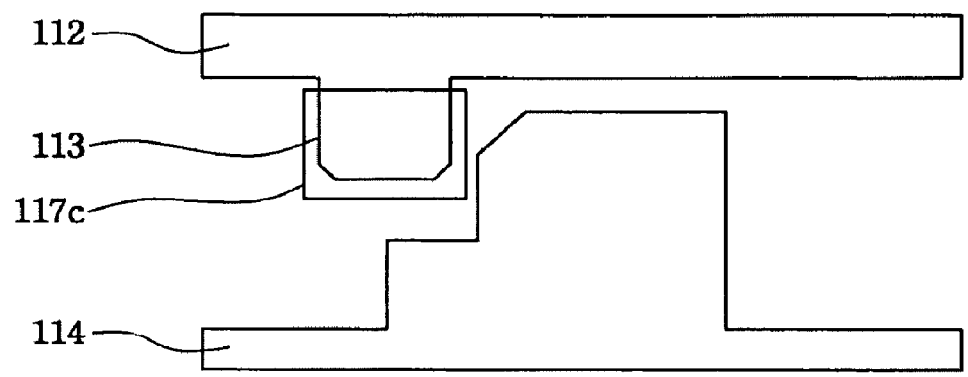
FIGS. 5A to 5E are plan views showing a method of manufacturing an array substrate according to another exemplary embodiment of the present disclosure.
Figure 5A:
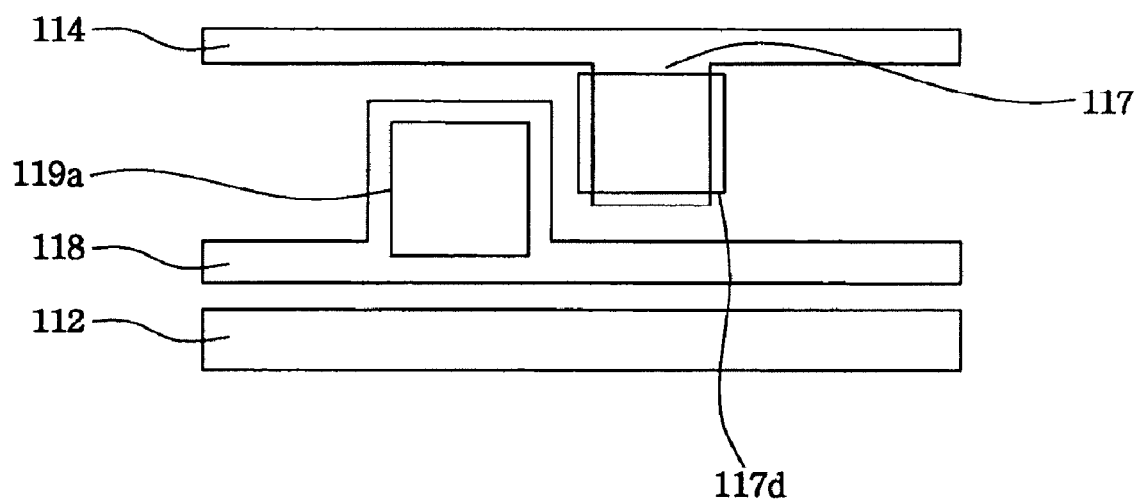

Referring to FIGS. 3 and 5A, a metal such as tantalum (Ta), titanium (Ti), molybdenum (Mo), aluminum (Al), chrome (Cr), copper (Cu), tungsten (W), or the like, is deposited on the transparent substrate 105. The deposited metal is patterned to form the gate line 112, the first gate electrode 113, the storage line 114, the first voltage line 116, the second gate electrode 117 and the second voltage line 118.

The gate line 112 is extended in the longitudinal direction, and arranged in the vertical direction. The first gate electrode 113 is electrically connected to the gate line 112. The storage line 114, the first voltage line 116 and the second voltage line 118 are arranged in substantially parallel with the gate line 112. The second gate electrode 117 is electrically connected to the first voltage line 116.

Silicon nitride (SiNx) is deposited on the transparent substrate 105 having the gate electrode 113. The silicon nitride (SiNx) may be deposited through a plasma enhanced chemical vapor deposition (PECVD). An amorphous silicon layer and an N+ amorphous silicon layer implanted in-situ with N+ dopants are formed on the gate insulating layer 119. The amorphous silicon layer and the N+ amorphous silicon layer are patterned to form a first active layer 117c and a second active layer 117d on the gate insulating layer 119 corresponding to the first and second gate electrodes 113 and 117. The first and second active layers 117c and 117d include a semiconductor layer 117a and an ohmic contact layer 117b. The gate insulating layer 119 corresponding to the second voltage line 118 is partially removed to form a fourth hole 119a.

The gate insulating layer 119 may be disposed over the entire surface of the transparent substrate 105. Alternatively, the gate insulating layer 119 may also be disposed on the gate line 112 and the gate electrode 113.

Figure 5B:
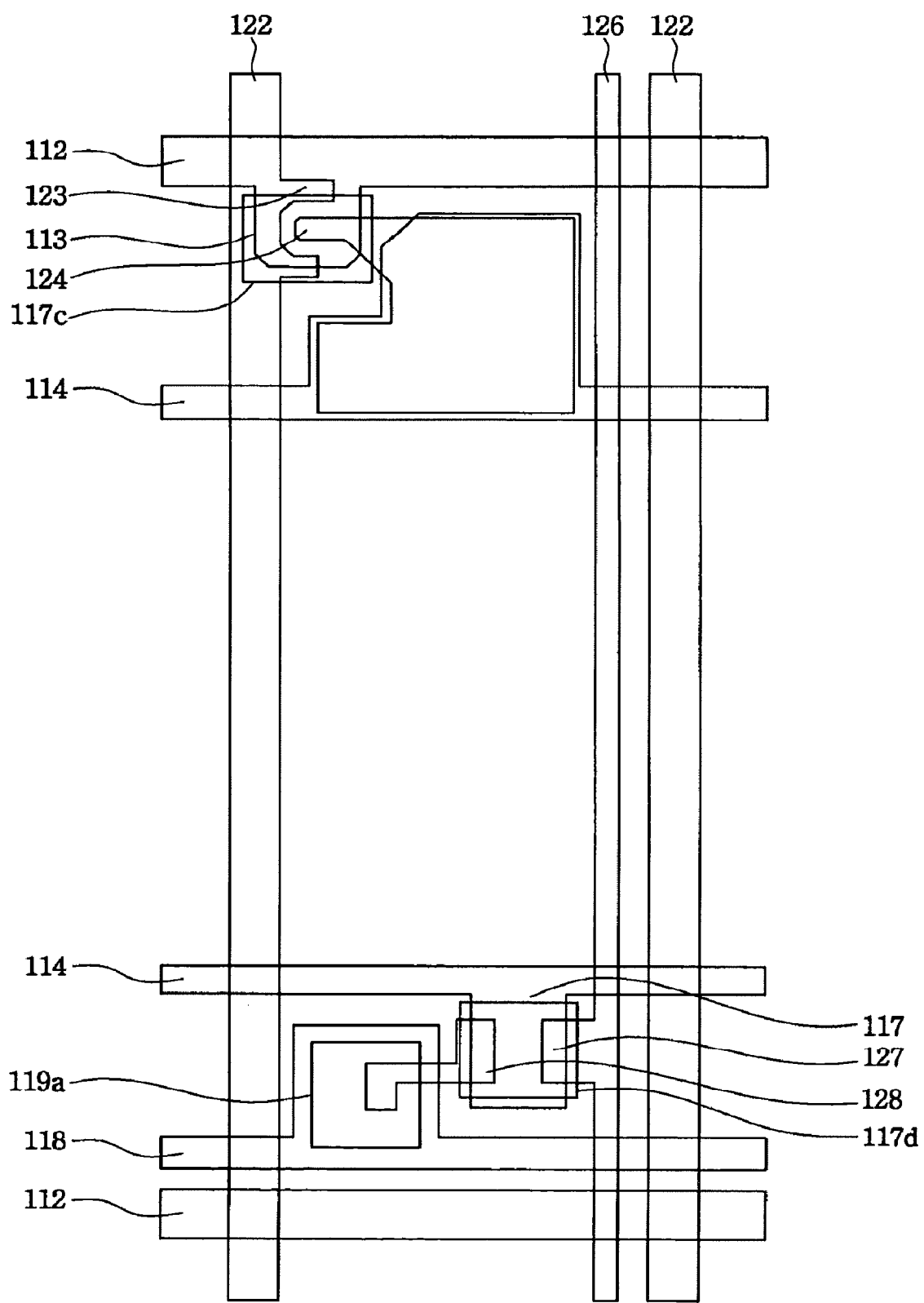

Referring to FIG. 5B, a metal such as tantalum (Ta), titanium (Ti), molybdenum (Mo), aluminum (Al), chrome (Cr), copper (Cu), tungsten (W), or the like, is deposited on the transparent substrate 105 having the gate insulating layer 119.

The deposited metal is patterned to form the data line 122, the first source electrode 123, the first drain electrode 124, the read out line 126, the second drain electrode 127 and the second source electrode 128. The first drain electrode 124 is partially overlapped with the capacitor line 114 to form the storage capacitor CST.

The data line 122 is extended in the vertical direction, and arranged in the longitudinal direction. The first source electrode 123 is electrically connected to the data line 122. The first drain electrode 124 is spaced apart from the first source electrode 123.

The read out line 126 is extended in the vertical direction, and arranged in the longitudinal direction. The second drain electrode 127 is electrically connected to the read out line 126. The second source electrode 128 is spaced apart from the second drain electrode 127, and electrically connected to the second voltage line 118 through the fourth hole 119a.

Figure 5C:
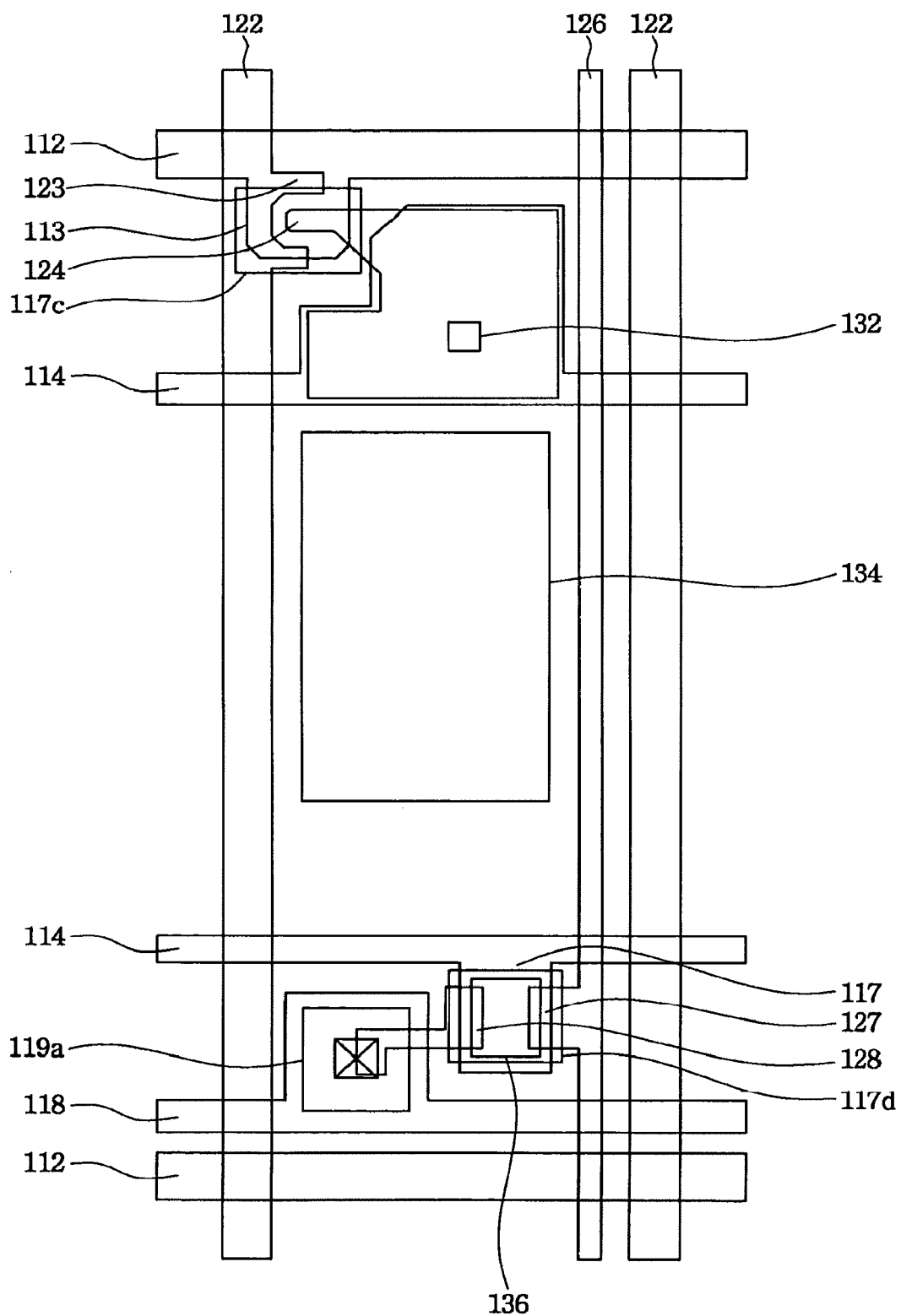

Referring to FIG. 5C, an organic material having photoresist is coated on the transparent substrate 105 having the data line 122, the first source electrode 123, the first drain electrode 124, the read out line 126, the second drain electrode 127 and the second source electrode 128 to form an organic insulating layer 130.

Alternatively, the organic material may be coated on the transparent substrate 105 through a spin coating process. The organic insulating layer 130 corresponding to the pixel defined by the gate and data lines 112 and 122 is partially removed to form the first hole 132, the opening window 134 and the second hole 136. The first drain electrode 124 is partially exposed through the first hole 132. The transparent substrate 105 or the gate insulating layer 119 is partially exposed through the opening window 134. The semiconductor layer 117a corresponding to the second gate electrode 117 is partially exposed through the second hole 136.

Figure 5D:
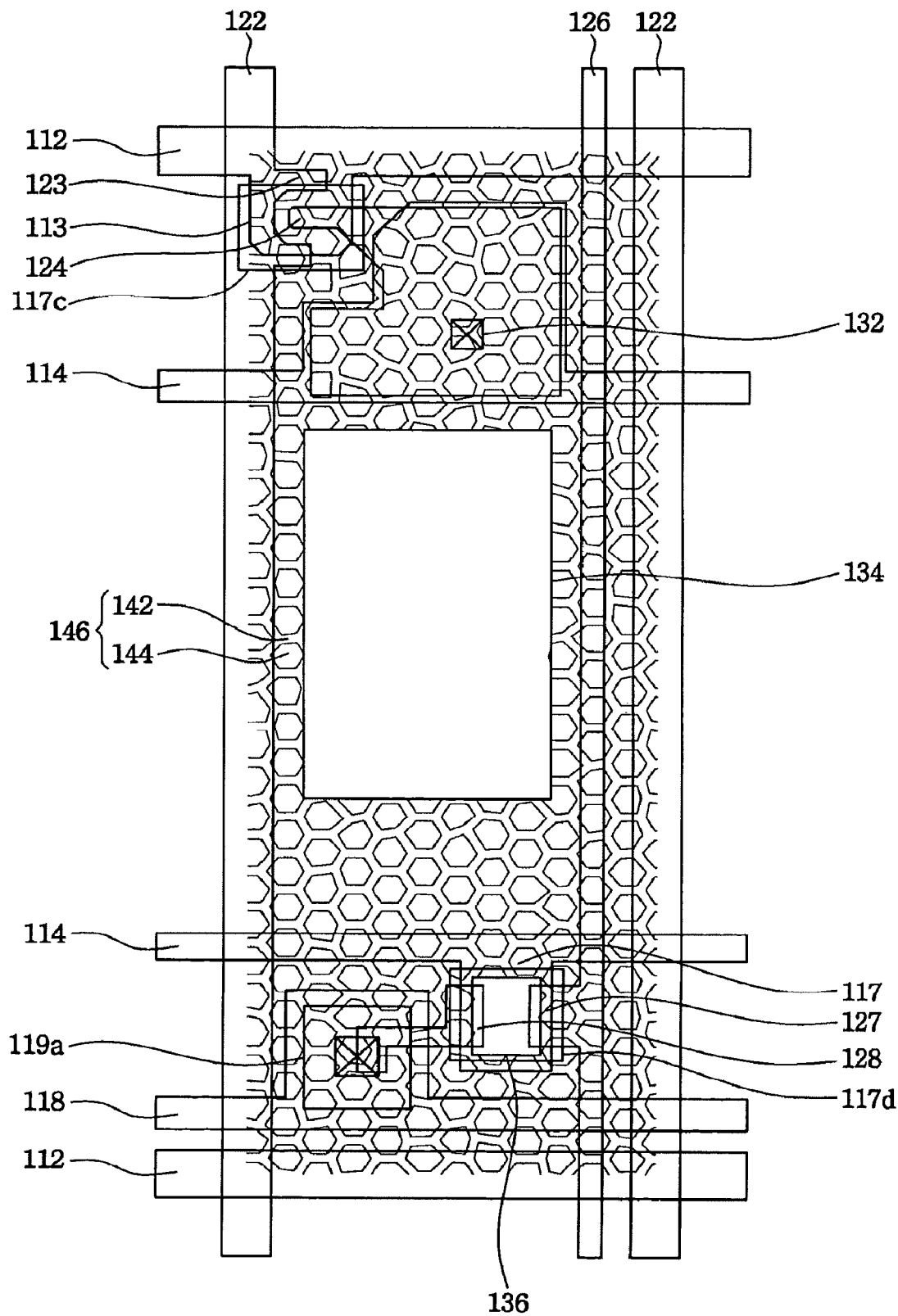

Referring to FIG. 5D, a plurality of recesses 142 and protrusions 144 is formed on the organic insulating layer 130 having the first hole 132, the opening window 134 and the second hole 136 so that an embossed pattern 146 is formed. A passivation layer 150 is formed on the organic insulating layer 130 having the embossed pattern. A reflectivity of the reflection plate 170 is improved by the embossed pattern. Alternatively, the embossed pattern 146 may be omitted.

Figure 5E:
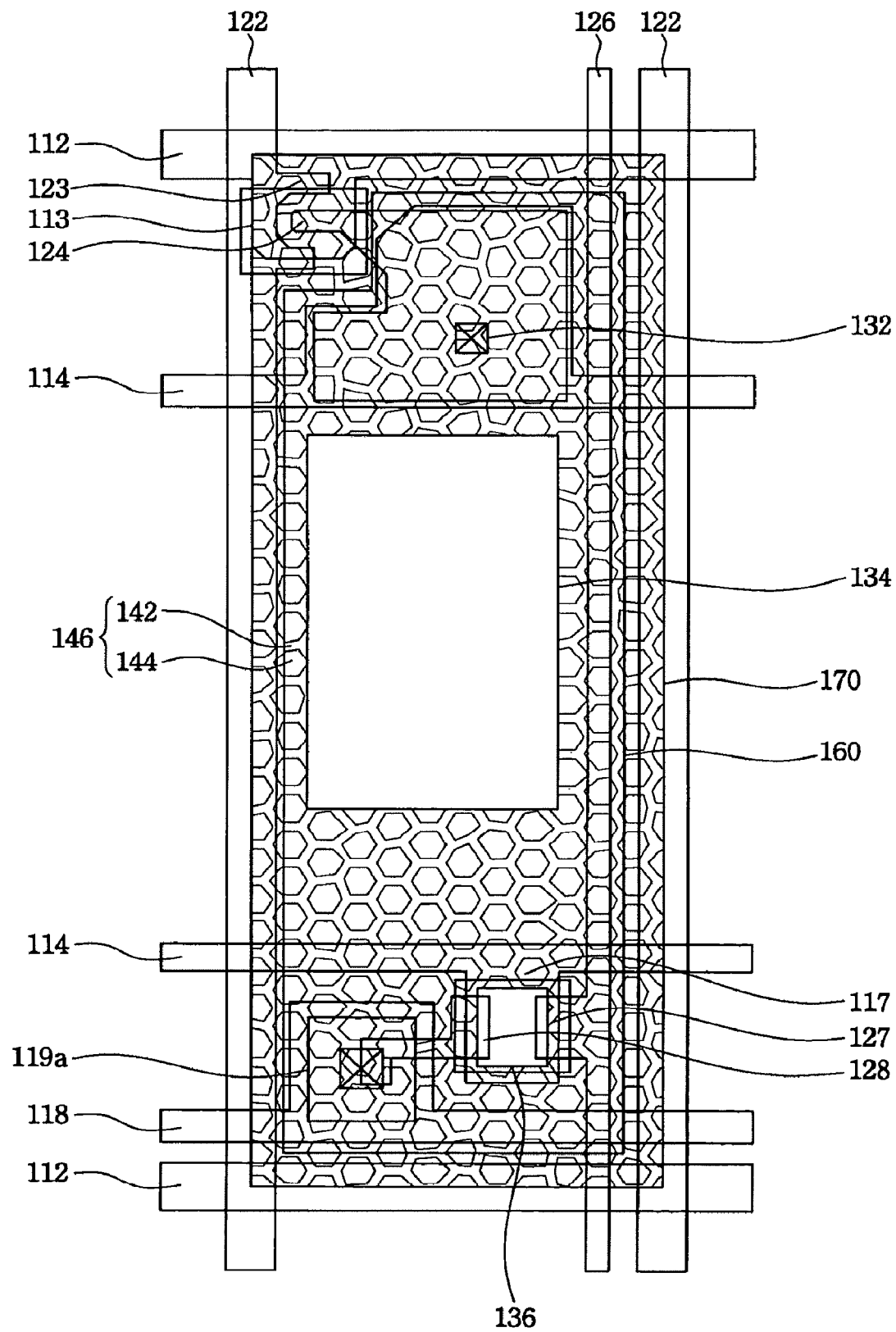

Referring to FIG. 5E, the pixel electrode 160 is formed on the passivation layer 150. The pixel electrode 160 is electrically connected to the first drain electrode 124 through the first hole 132. ITO or the like is coated on the passivation layer 150 and patterned to form the pixel electrode 160. Alternatively, the pixel electrode 160 may be formed through direct patterning. The pixel electrode 160 is spaced apart from the data line 122 and the gate line 112. Alternatively, the pixel electrode 160 may be partially overlapped with the data line 122 or the gate line 112.

The reflection plate 170 is formed on a portion of the pixel electrode 160 to complete the array substrate. The reflection plate 170 defines the opening window. The reflection plate 170 corresponding to the second hole 136 is opened so that the externally provided light is incident into the space between the second drain electrode 127 and the second source electrode 128. An alignment layer (not shown) for aligning a liquid crystal may be formed on the reflection plate 170.

The reflection plate 170 may be formed on the organic insulating layer 130 corresponding to the pixel. Alternatively, the reflection plate 170 may also be formed over the whole surface of the organic insulating layer 130.

Figure 6:
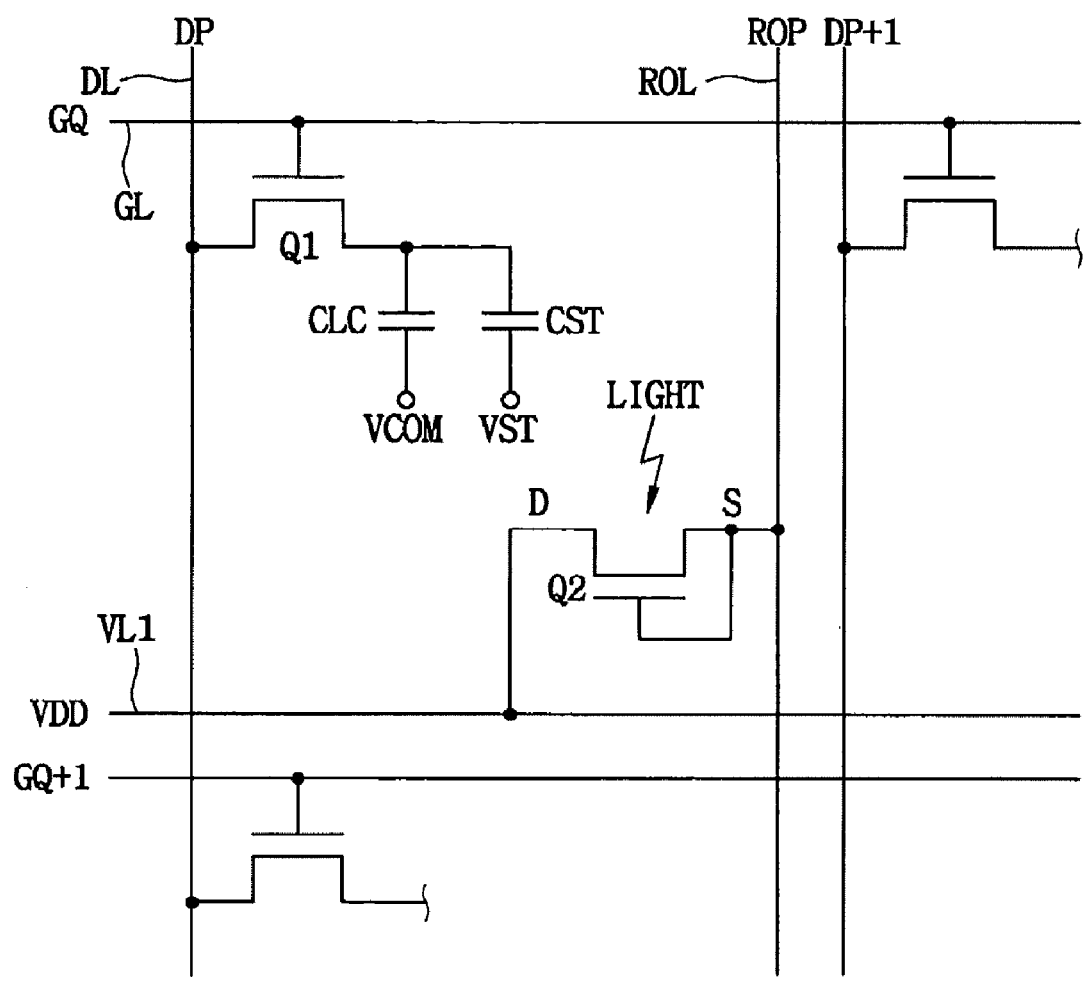
FIG. 6 is a circuit diagram showing a light sensing element according to another exemplary embodiment of the present disclosure.

FIG. 6 is a circuit diagram showing a light sensing element according to another exemplary embodiment of the present disclosure. The light sensing element of FIG. 6 is the same as in FIG. 2, except for a second voltage line and a second switching element. Thus, the same reference numerals will be used to refer to the same or like parts as those described in FIG. 2 and any further detailed description will be omitted for brevity.

Referring to FIG. 6, an LCD panel having the light sensing element includes a gate line GL, a data line DL, a first switching element Q1, a liquid crystal capacitor CLC, a storage capacitor CST, a first voltage line VLI, a second switching element Q2 and a read out line ROL. The LCD panel may include a plurality of the gate lines GL, a plurality of the data lines DL, a plurality of the first switching elements Q1, a plurality of the liquid crystal capacitors CLC, a plurality of the storage capacitors CST, a plurality of the first voltage lines VLI, a plurality of the second switching elements Q2 and a plurality of the read out lines ROL.

The gate line GL is extended in a longitudinal direction, and a gate signal GQ is transmitted to the first switching element Q1 through the gate line GL. The data line DL is extended in a vertical direction, and a data signal DP is transmitted to the first switching element Q1 through the data line DL.

The switching element Q1 is formed in a region defined by the gate and data lines GL and DL disposed adjacent to one another. A first source electrode of the first switching element Q1 is electrically connected to the data line DL, and a first gate electrode of the first switching element is electrically connected to the gate line GL. When the gate signal GQ having a high level is applied to the first switching element Q1, the first switching element Q1 is turned on so that the data signal is outputted to the liquid crystal capacitor CLC and the storage capacitor CST through a first drain electrode of the first switching element Q1.

A first terminal of the liquid crystal capacitor CLC is electrically connected to the first drain electrode of the first switching element Q1, and a common voltage VCOM is applied to a second terminal of the liquid crystal capacitor CLC. The data signal DP outputted from the first drain electrode of the first switching element Q1 is stored in the liquid crystal capacitor CLC.

A first terminal of the storage capacitor CST is electrically connected to the first drain electrode of the first switching element Q1. A storage voltage VST is applied to a second terminal of the storage capacitor CST. When the data signal DP outputted from the first drain electrode is stored in the storage capacitor CST and the first switching element Q1 is turned off, an electric charge stored in the liquid crystal capacitor CLC is discharged so that the stored electric charge is applied to the liquid crystal capacitor CLC.

The first voltage line VLI is extended in the longitudinal direction to apply a bias voltage VDD to the second switching element Q2. The bias voltage VDD is provided from an external source to the light sensing element.

The second switching element Q2 is formed in a region defined by the first voltage line VL1 and the read out line ROL adjacent to one another. A second source electrode of the second switching element Q2 is electrically connected to the first voltage line VL1, and a second gate electrode of the second switching element Q2 is electrically connected to the second drain electrode of the second switching element Q2 and the read out line ROL. When light is incident onto the second switching element Q2, a channel is formed between the second source electrode and the second drain electrode of the second switching element Q2 so that a light-induced leakage current flows into the read out line ROL through the second drain electrode of the second switching element Q2. The light-induced leakage current is a light sensing signal corresponding to a predetermined position.

The read out line ROL is extended in the vertical direction, and outputs the light sensing signal, i.e., the light-induced leakage current, from the second drain electrode of the second switching element Q2 into a driving integrated circuit (not shown).

In operation, when the bias voltage VDD and the light are applied to the second source electrode of the second switching element Q2 and the region between the second source electrode and the second drain electrode of the second switching element Q2, respectively, the light sensing signal is outputted to the read out line ROL through the second drain electrode of the second switching element Q2.

For example, when the light is not incident into the space between the second source electrode and the second drain electrode of the second switching element Q2, the light-induced leakage current may not flow between the second source electrode and the second drain electrode of the second switching element Q2, although the bias voltage VDD that alternates between about −7.5V and about +15V is applied to the second source electrode of the second switching element Q2.

When the light is incident into the space between the second source electrode and the second drain electrode of the second switching element Q2 and the bias voltage VDD that alternates between about −7.5V and about +15V is applied to the second source electrode of the second switching element Q2, the light-induced leakage current flows between the second source electrode and the second drain electrode of the second switching element Q2 so that the light-induced leakage current flows through the read out line ROL, thereby forming the light sensing signal. A read out integrated circuit (not shown) electrically connected to an end portion of the read out line generates positional information based on the light sensing signal. Alternatively, a second voltage line VL2 may be omitted to increase opening ratio of the LCD apparatus.

When the level of the light sensing signal is weak, an additional amplifier or a noise filter may be formed between the read out line and the read out integrated circuit (not shown).

Alternatively, the first voltage line VLI, the second switching element Q2 and the read out line ROL may be formed on an additional plate to form a pattern recognition panel. The pattern recognition panel may sense a fingerprint. Also, a touch panel may include the pattern recognition panel.

Figure 7:
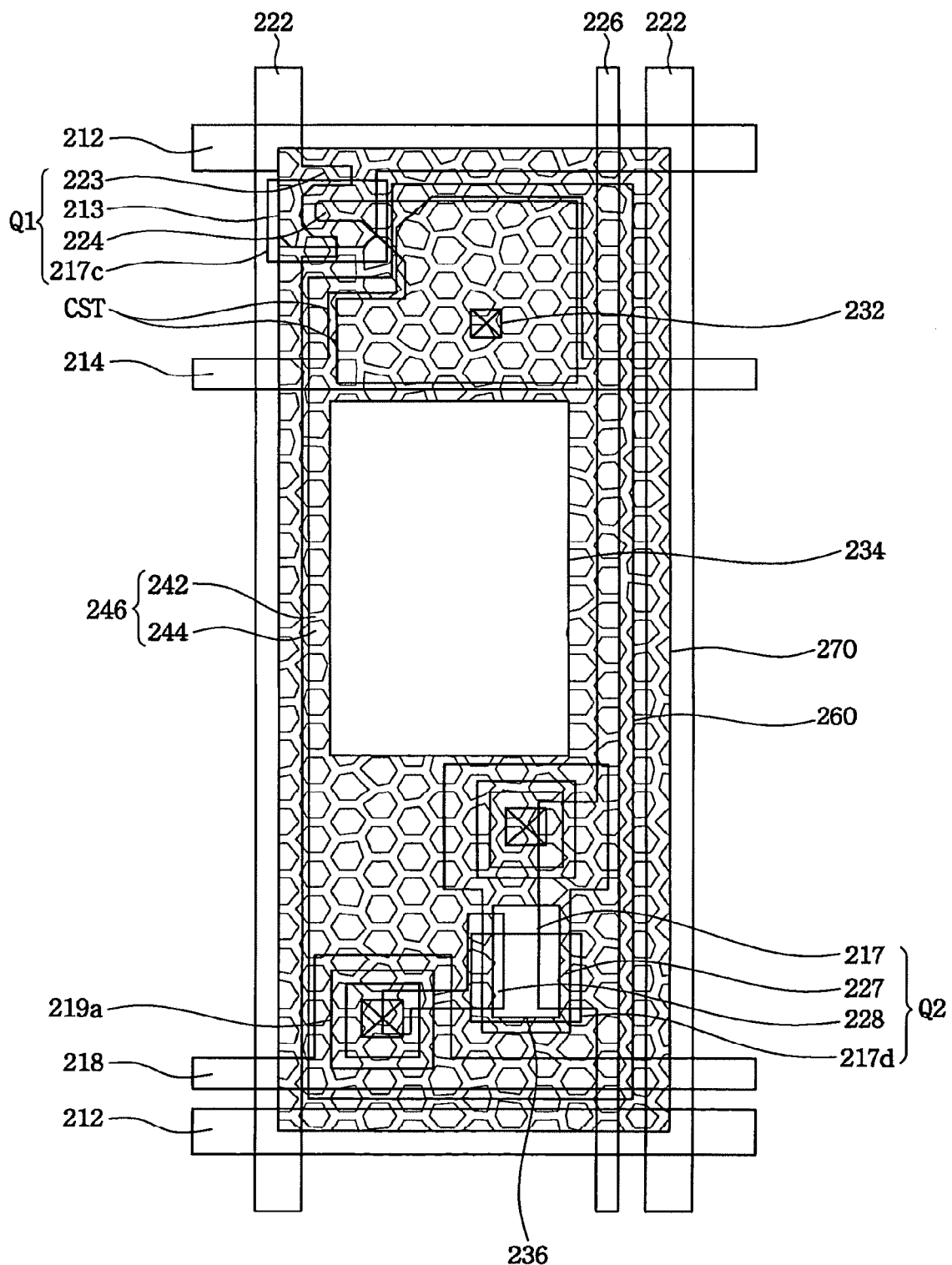
FIG. 7 is a plan view showing an array substrate according to another exemplary embodiment of the present disclosure.

FIG. 7 is a plan view showing an array substrate according to another exemplary embodiment of the present disclosure. The array substrate of FIG. 7 is the same as illustrated in FIG. 3, except for a second voltage line and a second switching element. Thus, the same reference numerals is used to refer to the same or like parts as those described in connection with FIG. 3 above, and further detailed description is omitted for brevity.

Referring to FIG. 7, the array substrate includes a transparent substrate, a gate line 212, a data line 222, a first switching element Q1 electrically connected to the gate line 212 and the data line 222, a storage capacitor CST, a first voltage line 218, a second switching element Q2, a read out line 226, a pixel electrode 260 and a reflection plate 270 defining a reflection region and an opening window 234. The array substrate may include a plurality of the gate lines 212, a plurality of the data lines 222, a plurality of the first switching elements Q1, a plurality of the storage capacitors CST, a plurality of the first voltage lines 218, a plurality of the second switching elements Q2, a plurality of the read out lines 226, a plurality of the pixel electrodes 260 and a plurality of the reflection plates 270.

The gate lines 212 are extended in a longitudinal direction, and arranged in a vertical direction. The data lines 222 are extended in the vertical direction, and arranged in the longitudinal direction. The gate and data lines 212 and 222 define a plurality of regions.

Each of the gate lines 212 and each of the data lines 222 are disposed on a transparent substrate. The first switching element Q1 is formed in the region defined by the gate and data lines 212 and 222 adjacent to one another. The first switching element Q1 includes a first gate electrode 213 electrically connected to the gate line 212, a first source electrode 223 electrically connected to the data line 222 and a first drain electrode 224 spaced apart from the first source electrode 223. The first gate electrode 213 is disposed between the first source electrode 223 and the first drain electrode 224, and electrically insulated from the first source electrode 223 and the first drain electrode 224.

The storage capacitor CST includes a first storage line 214 formed from a same layer with the gate line 212, and the first drain electrode 224 formed from a same layer with the data line 222.

A first voltage line 218 is disposed on the transparent substrate. The first voltage line 218 is extended in the longitudinal direction, and arranged in the vertical direction.

The read out line 226 is disposed on the transparent substrate. The read out line 226 is extended in substantially parallel with the data line 222, and arranged in the longitudinal direction.

The second switching element Q2 includes a second gate electrode, a second drain electrode electrically connected to the read out line 226 and a second source electrode spaced apart from the read out line 226. The second gate electrode 217 is electrically connected to the second drain electrode 227 through a contact hole.

The pixel electrode 260 comprises a transparent conductive material, such as indium tin oxide (ITO), indium zinc oxide (IZO), or the like. The pixel electrode 260 is disposed in the region defined by the gate and data lines 212 and 222 adjacent to one another. The pixel electrode 260 is electrically connected to the first drain electrode 224 through a first hole 232 so that the pixel electrode 260 is electrically connected to the first drain electrode 224.

The reflection plate 270 is formed on the pixel electrode 260 to define the reflection region reflecting an externally provided light and an opening window 234. An artificial light passes through the opening window 234. The reflection plate 270 includes a second hole 236 corresponding to the second switching element Q2 so that the externally provided light is incident into the space between the second source electrode and the second drain electrode.

FIGS. 8A to 8E are plan views showing a method of manufacturing an array substrate according to another exemplary embodiment of the present disclosure.

Figure 8A:
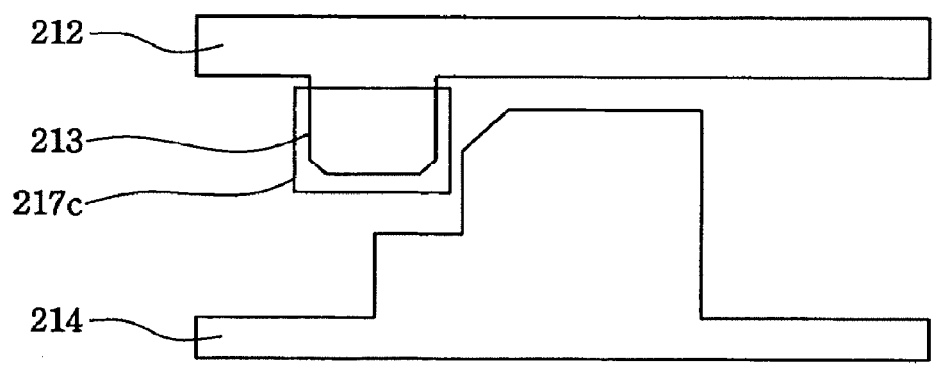
FIGS. 8A to 8E are plan views showing a method of manufacturing an array substrate according to another exemplary embodiment of the present disclosure.
Figure 8A:
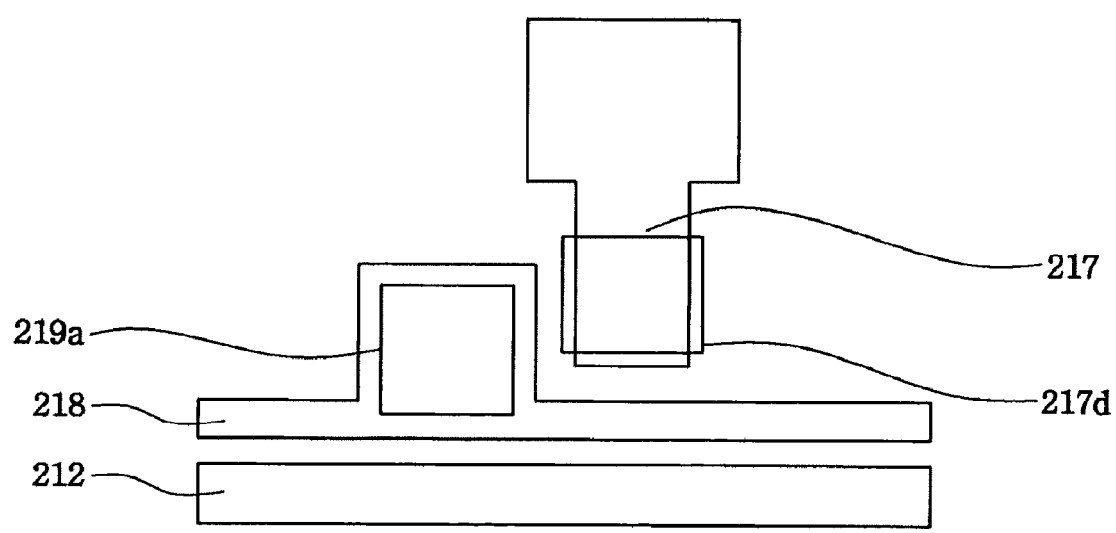

Referring to FIGS. 7 and 8A, a metal such as tantalum (Ta), titanium (Ti), molybdenum (Mo), aluminum (Al), chrome (Cr), copper (Cu), tungsten (W), or the like, is deposited on the transparent substrate comprising glass or ceramics. The deposited metal is patterned to form the gate line 212, the first gate electrode 213, the storage line 214, the first voltage line 218 and the second gate electrode 217.

The gate line 212 is extended in the longitudinal direction, and arranged in the vertical direction. The first gate electrode 213 is electrically connected to the gate line 212. The storage line 214 and the first voltage line 218 are arranged in substantially parallel with the gate line 212. The second gate electrode 217 is spaced apart from the first voltage line 218.

Silicon nitride (SiNx) is deposited on the transparent substrate having the gate electrode 213. The silicon nitride (SiNx) may be deposited through a plasma enhanced chemical vapor deposition. An amorphous silicon layer and an N+ amorphous silicon layer implanted in situ with N+ dopants are formed on the gate insulating layer (not shown). The amorphous silicon layer and the Ni+ amorphous silicon layer are patterned to form a first active layer 217c and a second active layer 217d on the gate insulating layer (not shown) corresponding to the first and second gate electrodes 213 and 217, respectively. The gate insulating layer (not shown) corresponding to the first voltage line 218 is partially removed to form a fourth hole 219a. The first voltage line 218 is partially exposed through the fourth hole 219a.

The gate insulating layer (not shown) may be disposed over the whole surface of the transparent substrate. Alternatively, the gate insulating layer (not shown) may also be disposed on the gate line 212 and the gate electrode 213.

Figure 8B:
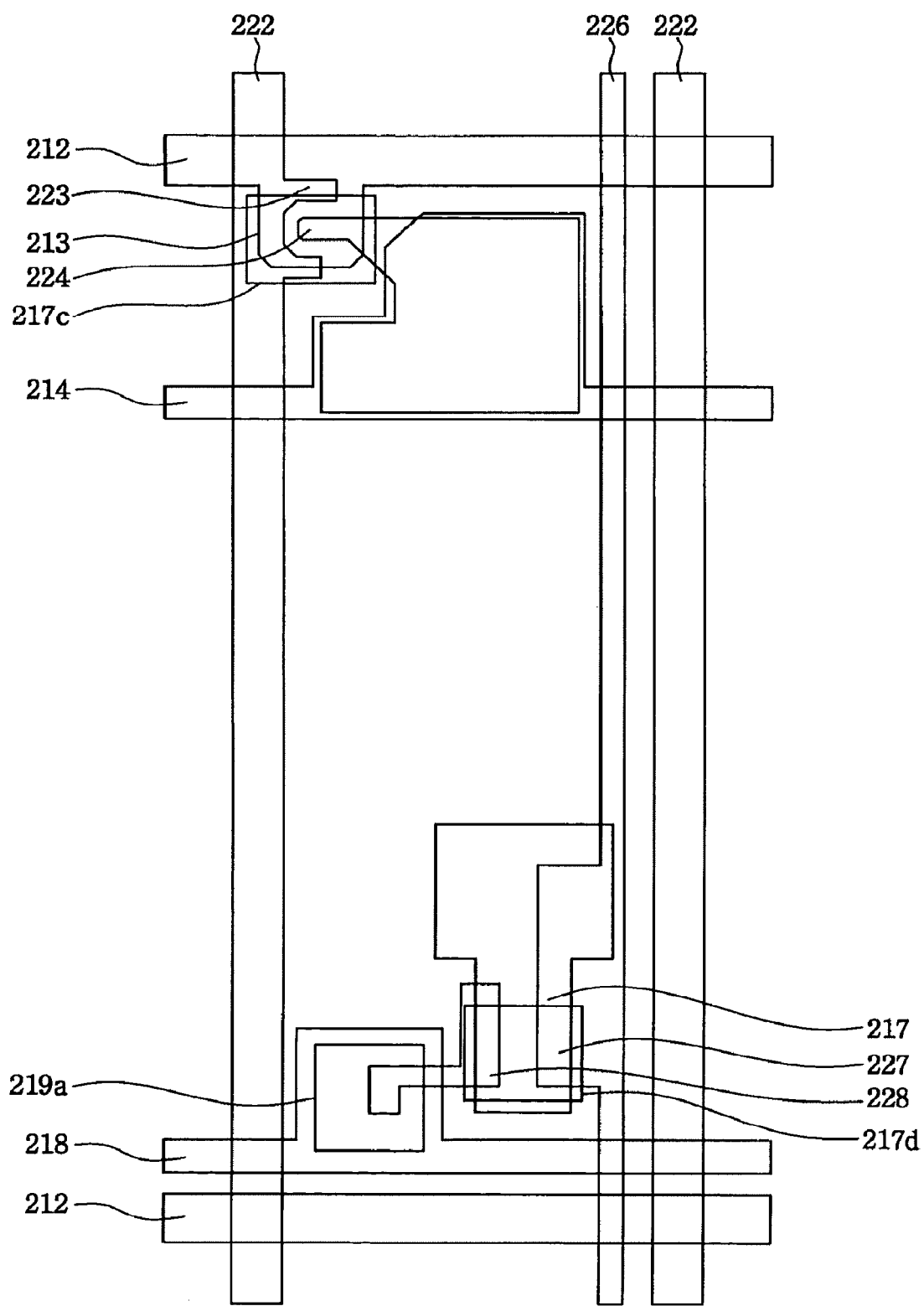

Referring to FIG. 8B, a metal such as tantalum (Ta), titanium (Ti), molybdenum (Mo), aluminum (Al), chrome (Cr), copper (Cu), tungsten (W), or the like, is deposited on the transparent substrate having the gate insulating layer (not shown).

The deposited metal is patterned to form the data line 222, the first source electrode 223, the first drain electrode 224, the read out line 226, the second drain electrode 227 and the second source electrode 228. The first drain electrode 224 is partially overlapped with the capacitor line 214 to form the storage capacitor CST.

The data line 222 is extended in the vertical direction, and arranged in the longitudinal direction. The first source electrode 223 is electrically connected to the data line 222. The first drain electrode 224 is spaced apart from the first source electrode 223.

The read out line 226 is extended in the vertical direction, and arranged in the longitudinal direction. The second drain electrode 227 is electrically connected to the read out line 226. The second source electrode 228 is spaced apart from the second drain electrode 227, and electrically connected to the second voltage line 218 through the fourth hole 219a.

Figure 8C:
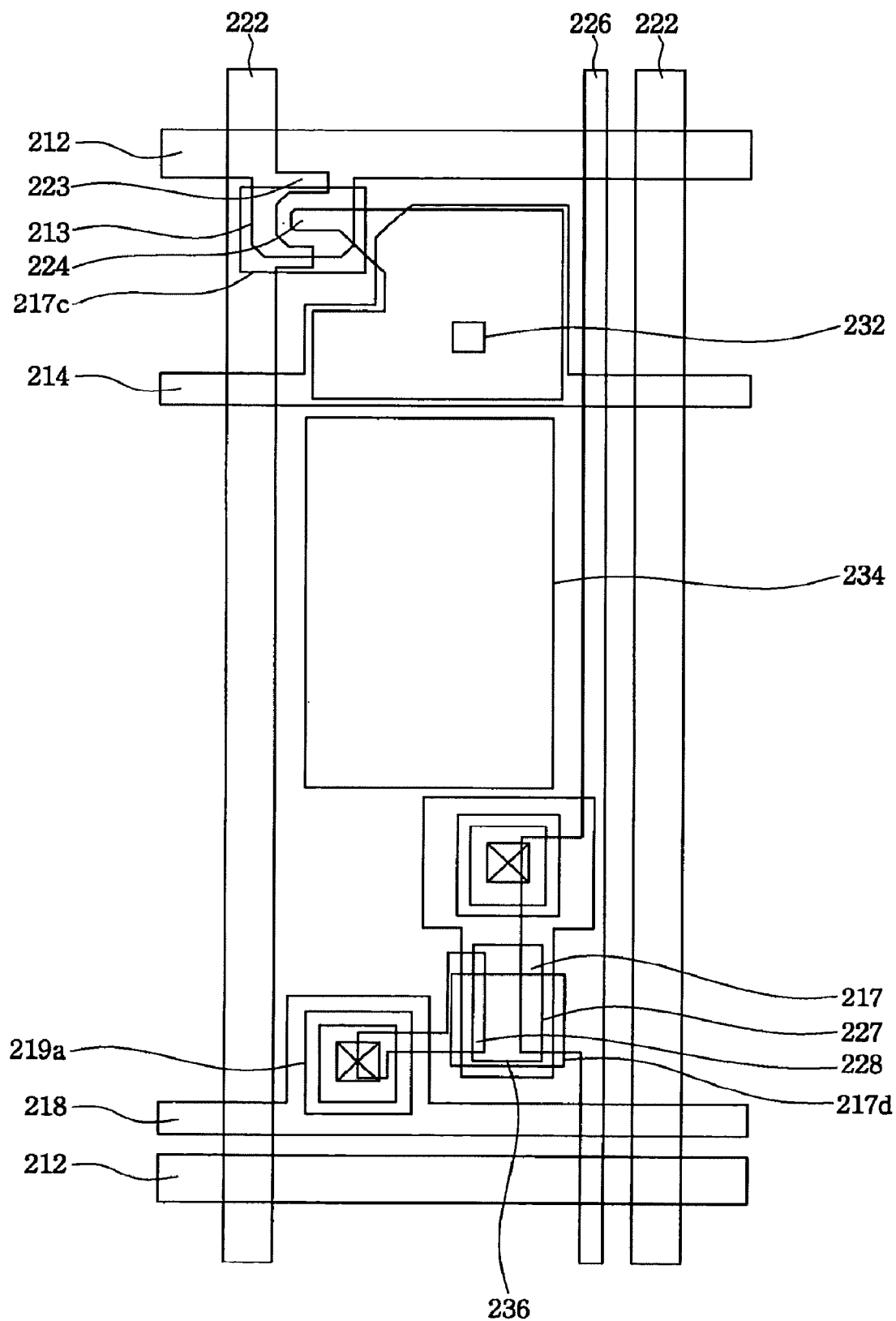

Referring to FIG. 8C, an organic material having photoresist is coated on the transparent substrate having the data line 222, the first source electrode 223, the first drain electrode 224, the read out line 226, the second drain electrode 227 and the second source electrode 228 to form an organic insulating layer (not shown). Alternatively, the organic material may be coated on the transparent substrate through a spin coating process. The organic insulating layer (not shown) corresponding to the pixel defined by the gate and data lines 212 and 222 is partially removed to form the first hole 232, the opening window 234 and the second hole 236. The first drain electrode 224 is partially exposed through the first hole 232. The transparent substrate or the gate insulating layer (not shown) is partially exposed through the opening window 234. The second active layer 217d is partially exposed through the second hole 236. The externally provided light may be incident into the second active layer 217d through the second hole 236.

Figure 8D:
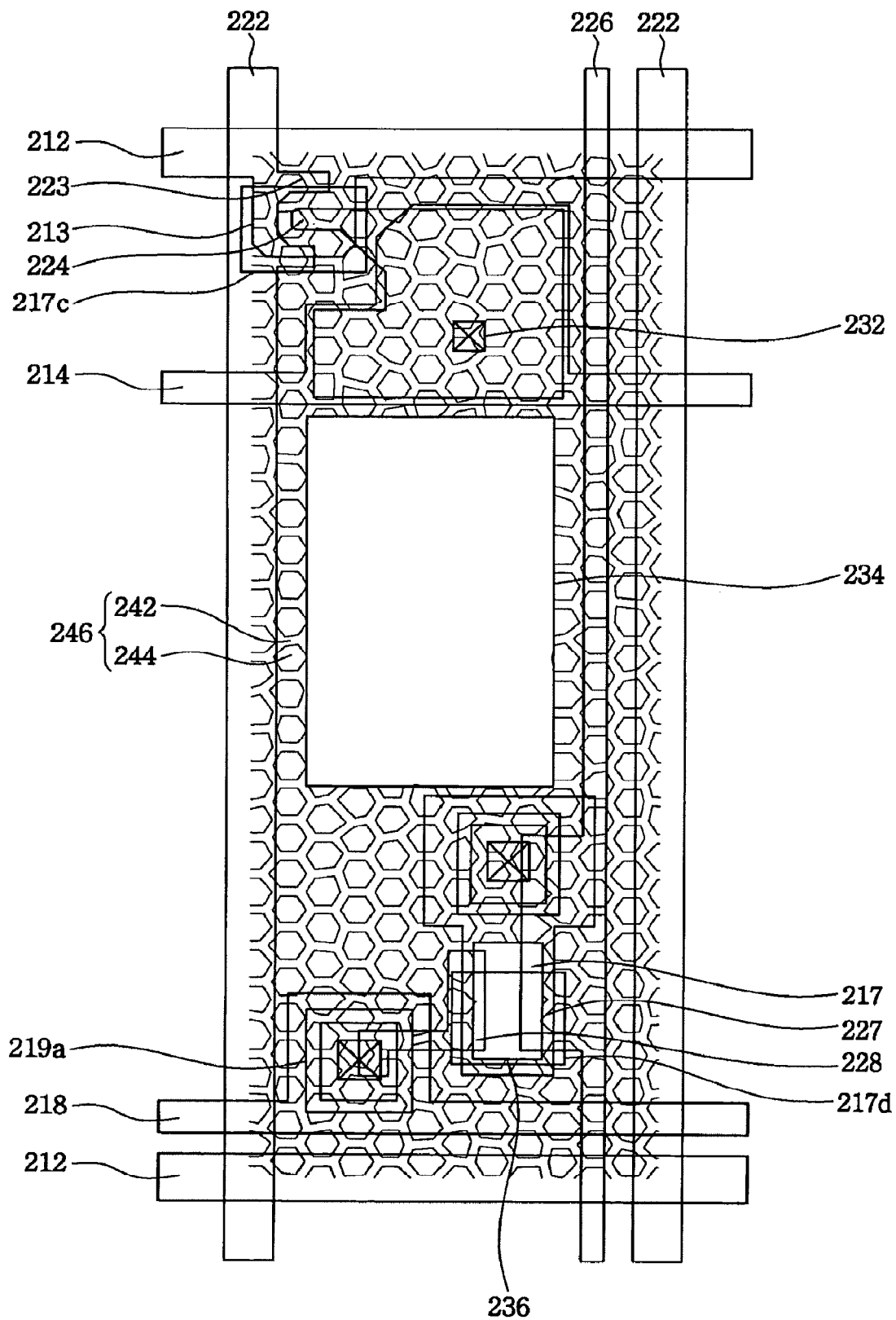

Referring to FIG. 8D, a plurality of recesses 242 and protrusions 244 is formed on the organic insulating layer (not shown) having the first hole 232, the opening window 234 and the second hole 236 so that an embossed pattern 246 is formed. A passivation layer is formed on the organic insulating layer (not shown) having the embossed pattern 246. A reflectivity of the reflection plate 270 is improved by the embossed pattern 246. Alternatively, the embossed pattern 246 may be omitted.

Figure 8E:
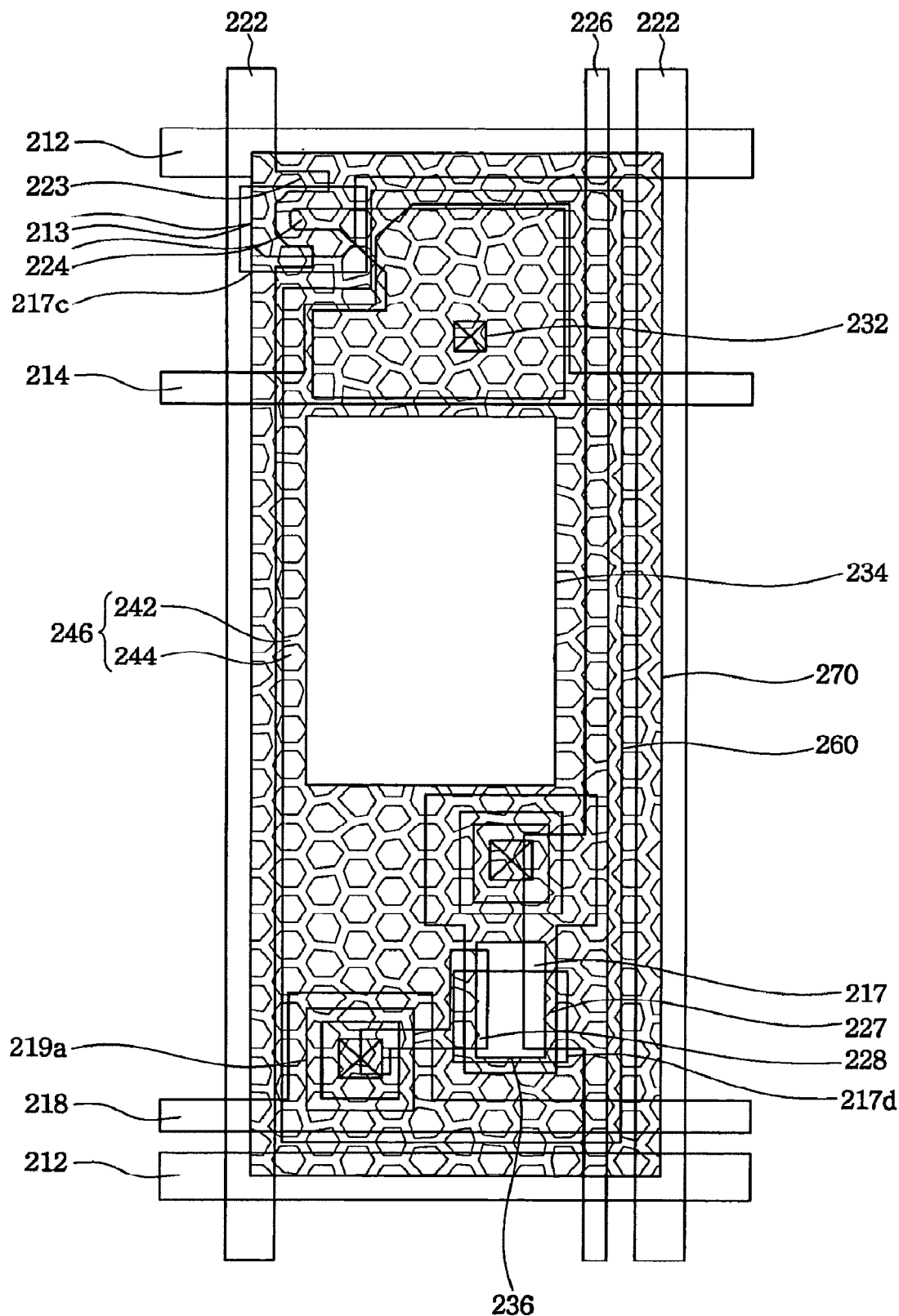

Referring to FIG. 8E, the pixel electrode 260 is formed on the passivation layer. The pixel electrode 260 is electrically connected to the first drain electrode 224 through the first hole 232. The pixel electrode 260 may be formed through coating ITO on the passivation layer and patterning the coated ITO. Alternatively, the pixel electrode 260 may be formed through direct patterning. The pixel electrode 260 is spaced apart from the data line 222 and the gate line 212. Alternatively, the pixel electrode 260 may be partially overlapped with the data line 222 or the gate line 212.

The reflection plate 270 is formed on a portion of the pixel electrode 260 to complete the array substrate. The reflection plate 270 defines the opening window 234. The reflection plate 270 corresponding to the second hole 236 is opened so that the externally provided light is incident into the space between the second drain electrode 227 and the second source electrode 228. An alignment layer (not shown) for aligning a liquid crystal may be formed on the reflection plate 270.

The reflection plate 270 may be formed on the organic insulating layer (not shown) corresponding to the pixel. Alternatively, the reflection plate 270 may be formed over the whole surface of organic insulating layer (not shown).

Figure 9:
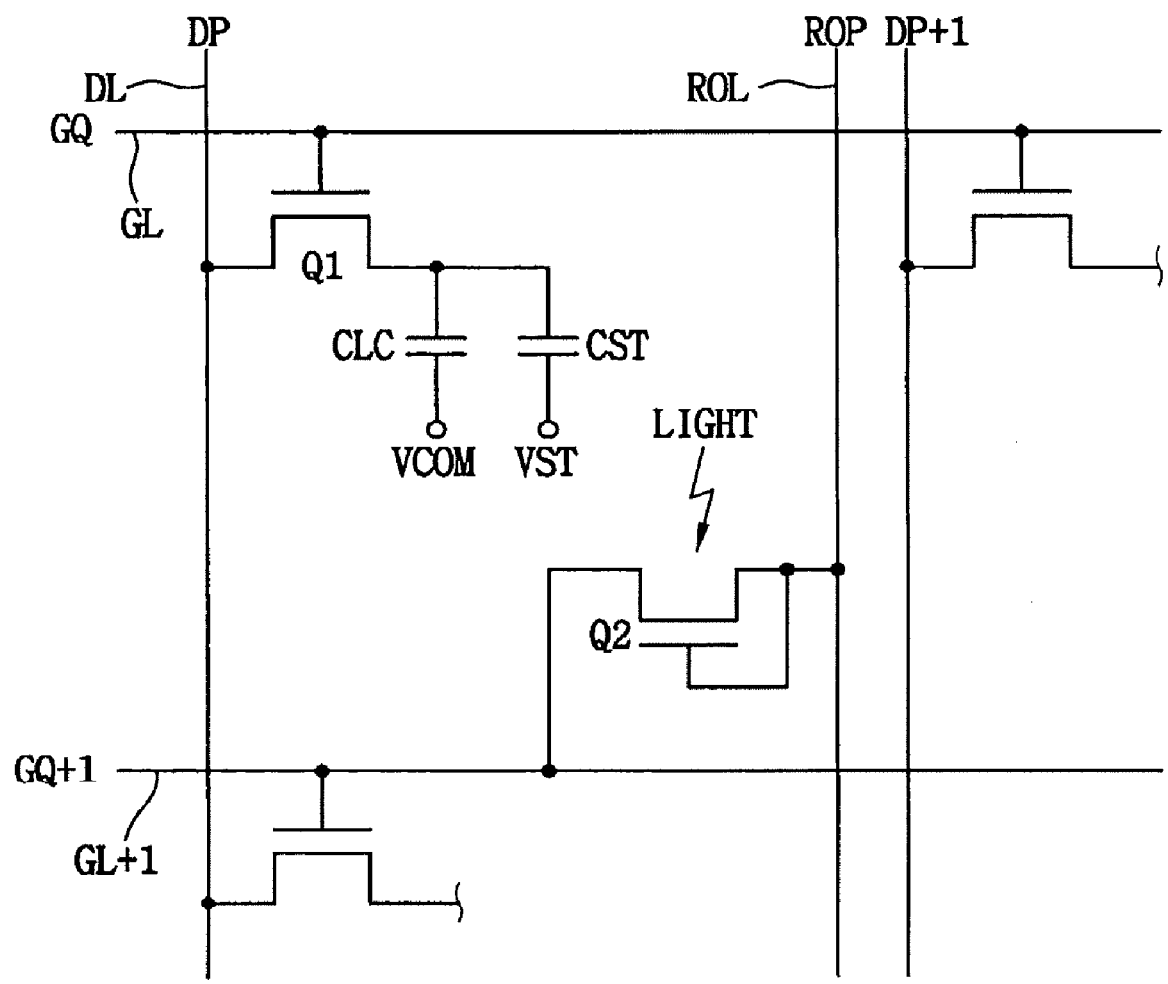
FIG. 9 is a circuit diagram showing a light sensing element according to another exemplary embodiment of the present disclosure.

FIG. 9 is a circuit diagram showing a light sensing element according to another exemplary embodiment of the present disclosure. The light sensing element of FIG. 9 is same as that illustrated in FIG. 2, except for a second voltage line and a second switching element. Thus, the same reference numerals will be used to refer to the same or like parts as those described in FIG. 2, and any further detailed description of these is omitted below.

Referring to FIG. 9, an LCD panel having the light sensing element includes a gate line GL, a data line DL, a first switching element Q1, a liquid crystal capacitor CLC, a storage capacitor CST, a second switching element Q2 and a read out line ROL. The LCD panel may include a plurality of the gate lines GL and GL+1, a plurality of the data lines DL, a plurality of the first switching elements Q1, a plurality of the liquid crystal capacitors CLC, a plurality of the storage capacitors CST, a plurality of the second switching elements Q2 and a plurality of read out lines ROL.

The gate line GL is extended in a longitudinal direction, and a gate signal GQ is transmitted to the first switching element Q1 through the gate line CL. The data line DL is extended in a vertical direction, and a data signal DP is transmitted to the first switching element Q1 through the data line DL.

The switching element Q1 is formed in a region defined by the gate and data lines GL and DL adjacent to one another. A first source electrode of the first switching element Q1 is electrically connected to the data line DL, and a first gate electrode of the first switching element Q1 is electrically connected to the gate line GL. When the gate signal GQ having a high level is applied to the first switching element Q1, the first switching element Q1 is turned on so that the data signal is outputted to the liquid crystal capacitor CLC and the storage capacitor CST through a first drain electrode of the first switching element Q1.

A first terminal of the liquid crystal capacitor CLC is electrically connected to the first drain electrode of the first switching element Q1, and a common voltage VCOM is applied to a second terminal of the liquid crystal capacitor CLC. The data signal DP outputted from the first drain electrode of the first switching element Q1 is stored in the liquid crystal capacitor CLC.

A first terminal of the storage capacitor CST is electrically connected to the first drain electrode of the first switching element Q1. A storage voltage VST is applied to a second terminal of the storage capacitor CST. When the data signal DP outputted from the first drain electrode is stored in the storage capacitor CST and the first switching element Q1 is turned off, an electric charge stored in the liquid crystal capacitor CLC is discharged so that the stored electric charge is applied to the liquid crystal capacitor CLC.

The second switching element Q2 is formed in a region defined by the gate line GL and the read out line ROL adjacent to one another. A second source electrode of the second switching element Q2 is electrically connected to a next gate line GL+1, and a second gate electrode of the second switching element Q2 is electrically connected to the second drain electrode of the second switching element Q2 and the read out line ROL. When a light is incident onto the second switching element Q2, a channel is formed between the second source electrode and the second drain electrode of the second switching element Q2 so that a light-induced leakage current flows into the read out line ROL through the second drain electrode of the second switching element Q2. The light-induced leakage current is a light sensing signal corresponding to a predetermined position on the array.

The read out line ROL is extended in the vertical direction, and outputs the light sensing signal that is the light-induced leakage current from the second drain electrode of the second switching element Q2 into a driving integrated circuit (not shown).

In operation, when a next gate signal GQ+1 and the light are applied to the second source electrode of the second switching element Q2 and the region between the second source electrode and the second drain electrode of the second switching element Q2, respectively, the light sensing signal is outputted to the read out line ROL through the second drain electrode of the second switching element Q2.

For example, when light is not incident into the space between the second source electrode and the second drain electrode of the second switching element Q2, the light-induced leakage current does not flow between the second source electrode and the second drain electrode of the second switching element Q2 even though the next gate signal GQ+1 having a high level is applied to the second source electrode of the second switching element Q2.

When the light is incident into the space between the second source electrode and the second drain electrode of the second switching element Q2 and the next gate signal GQ+1 having the high level is applied to the second source electrode of the second switching element Q2, the light-induced leakage current flows between the second source electrode and the second drain electrode of the second switching element Q2 so that the light-induced leakage current flows through the read out line ROL, thereby forming the light sensing signal. A read out integrated circuit (not shown) electrically connected to an end portion of the read out line generates positional information based on the light sensing signal. Alternatively, a first voltage line and a second voltage line may be omitted to increase opening ratio of the LCD apparatus.

Alternatively, the second switching element Q2 and the read out line ROL may be formed on an additional plate to form a pattern recognition panel. The pattern recognition panel may sense, for example, the touch of a finger. A touch panel may include the pattern recognition panel.

Figure 10:
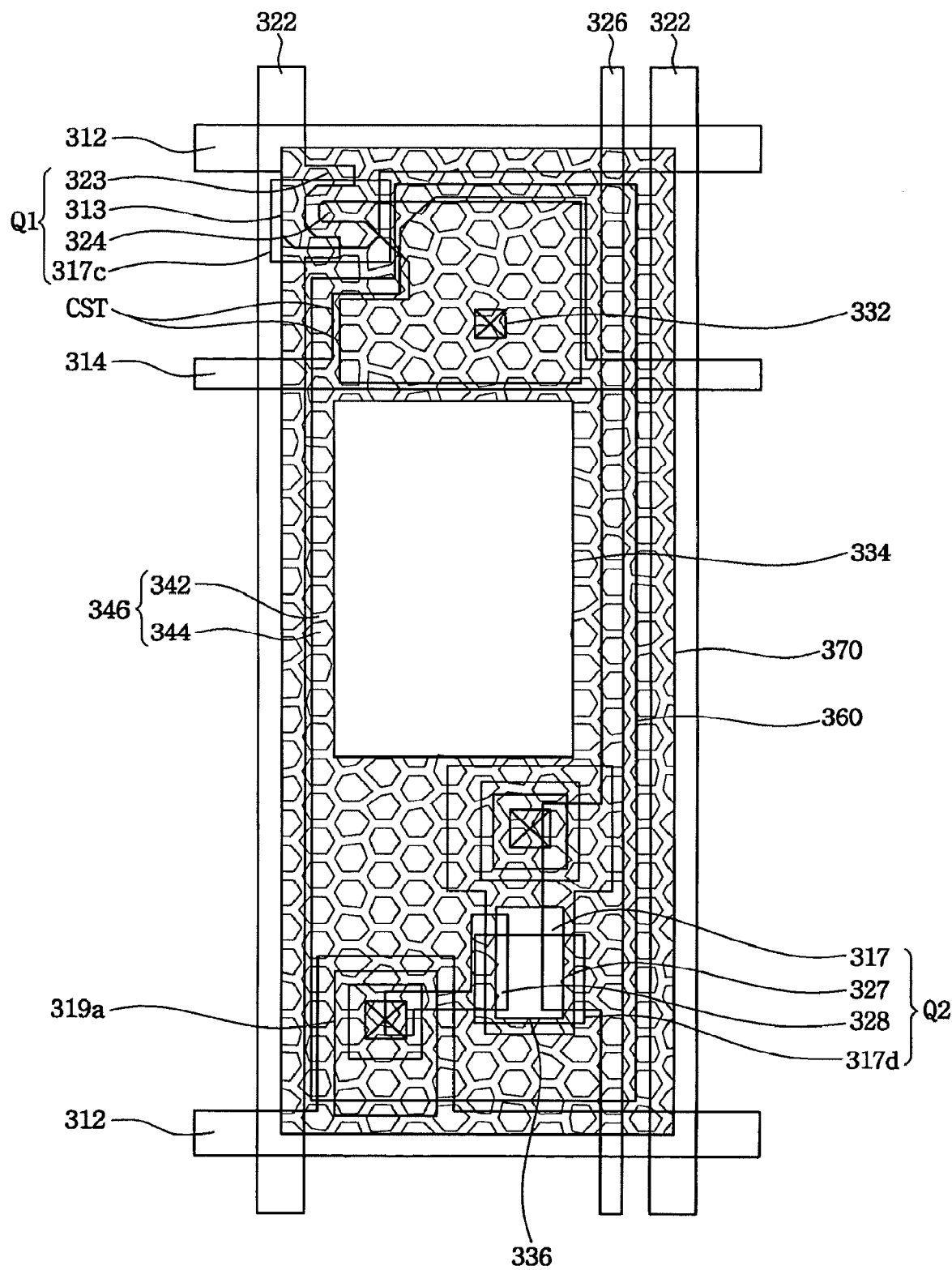
FIG. 10 is a plan view showing an array substrate according to another exemplary embodiment of the present disclosure.

FIG. 10 is a plan view showing an array substrate according to another exemplary embodiment of the present disclosure. The array substrate of FIG. 10 is same as that shown in FIG. 3, except for a first voltage line, a second voltage line and a second switching element. Thus, the same reference numerals are used to refer to the same or like parts as those described in FIG. 3, and any further description of these is omitted.

Referring to FIG. 10, the array substrate includes a transparent substrate, a gate line 312, a data line 322, a first switching element Q1 electrically connected to the gate line 312 and the data line 322, a storage capacitor CST, a second switching element Q2, a read out line 326, a pixel electrode 360 and a reflection plate 370 defining a reflection region and an opening window 334. The array substrate may include a plurality of the gate lines 312, a plurality of the data lines 322, a plurality of the first switching elements Q1, a plurality of the storage capacitors CST, a plurality of the second switching elements Q2, a plurality of the read out lines 326, a plurality of the pixel electrodes 360 and a plurality of the reflection plates 370.

The gate lines 312 are extended in a longitudinal direction, and arranged in a vertical direction. The data lines 322 are extended in the vertical direction, and arranged in the longitudinal direction. The gate and data lines 312 and 322 define a plurality of regions.

Each of the gate lines 312 and each of the data lines 322 are disposed on a transparent substrate. The first switching element Q1 is formed in the region defined by the gate and data lines 312 and 322 adjacent to one another. The first switching element Q1 includes a first gate electrode 313 electrically connected to the gate line 312, a first source electrode 323 electrically connected to the data line 322 and a first drain electrode 324 spaced apart from the first source electrode 323. The first gate electrode 313 is disposed between the first source electrode 323 and the first drain electrode 324, and electrically insulated from the first source electrode 323 and the first drain electrode 324.

The storage capacitor CST includes a first storage line 314 formed from a same layer with the gate line 312, and the first drain electrode 324 formed from a same layer with the data line 322.

The read out line 326 is disposed on the transparent substrate. The read out line 326 is extended in substantially parallel with the data line 322, and arranged in the longitudinal direction.

The second switching element Q2 includes a second gate electrode, a second drain electrode electrically connected to the read out line 326 and a second source electrode spaced apart from the read out line 326. The second gate electrode 317 is electrically connected to the second drain electrode 327 through a contact hole.

The pixel electrode 360 comprises a transparent conductive material, such as indium tin oxide (ITO), indium zinc oxide (IZO), or the like. The pixel electrode 360 is disposed in the region defined by the gate and data lines 312 and 322 adjacent to one another. The pixel electrode 360 is electrically connected to the first drain electrode 324 through a first hole 332 so that the pixel electrode 360 is electrically connected to the first drain electrode 324.

The reflection plate 370 is formed on the pixel electrode 360 to define the reflection region reflecting an externally provided light and an opening window 334.

An artificial light passes through the opening window 334. The reflection plate 370 includes a second hole 336 corresponding to the second switching element Q2 so that the externally provided light is incident into the space between the second source electrode and the second drain electrode.

FIGS. 11A to 11E are plan views showing a method of manufacturing an array substrate according to another exemplary embodiment of the present disclosure.

Figure 11A:
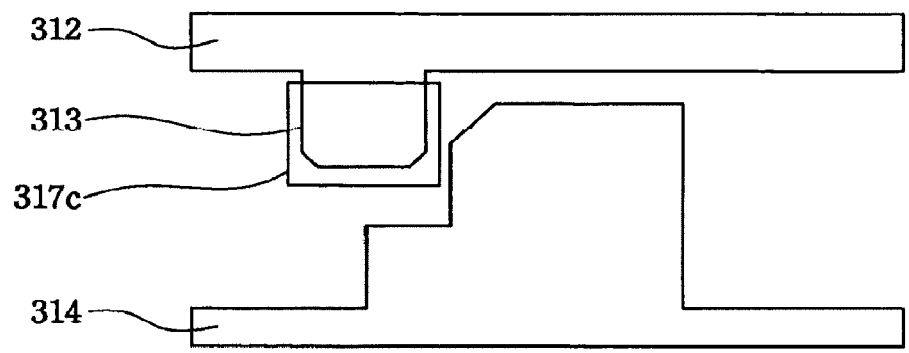
FIGS. 11A to 11E are plan views showing a method of manufacturing an array substrate according to another exemplary embodiment of the present disclosure; and, FIG. 12 is a circuit diagram showing a light sensing element according to another exemplary embodiment of the present disclosure.
Figure 11A:
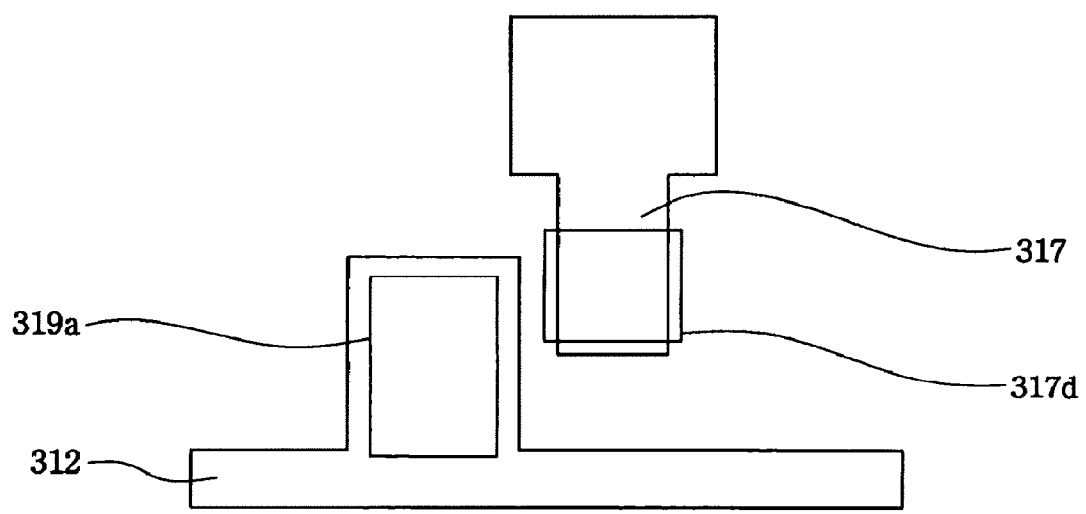

Referring to FIGS. 10 and 11A, a metal such as tantalum (Ta), titanium (Ti), 25 molybdenum (Mo), aluminum (Al), chrome (Cr), copper (Cu), tungsten (W), or the like, is deposited on the transparent substrate comprising a glass or ceramic. The deposited metal is patterned to form the gate line 312, the first gate electrode 313, the storage line 314 and the second gate electrode 317.

The gate line 312 is extended in the longitudinal direction, and arranged in the vertical direction. The first gate electrode 313 is electrically connected to the gate line 312. The storage line 314 is arranged in substantially parallel with the gate line 312. The second gate electrode 317 is spaced apart from the gate line 312.

Silicon nitride (SiNx) is deposited on the transparent substrate having the gate electrode 313. The silicon nitride (SiNx) may be deposited through a plasma enhanced chemical vapor deposition. An amorphous silicon layer and an Ni+ amorphous silicon layer implanted in-situ with Ni+ dopants are formed on the gate insulating layer (not shown). The amorphous silicon layer and the N+ amorphous silicon layer are patterned to form a first active layer 317c and a second active layer 317d on the gate insulating layer (not shown)

corresponding to the first and second gate electrodes 313 and 317. The gate insulating layer (not shown) corresponding to the gate line 312 is partially removed to form a fourth hole 319a. The gate line 312 is partially exposed through the fourth hole 319a. A portion of the gate line 312 may be protruded in the vertical direction to form the fourth hole 319a on the protruded portion of the gate line 312.

The gate insulating layer (not shown) may be disposed over the whole surface of the transparent substrate. Alternatively, the gate insulating layer (not shown) may also be disposed on the gate line 212 and the gate electrode 213.

Figure 11B:
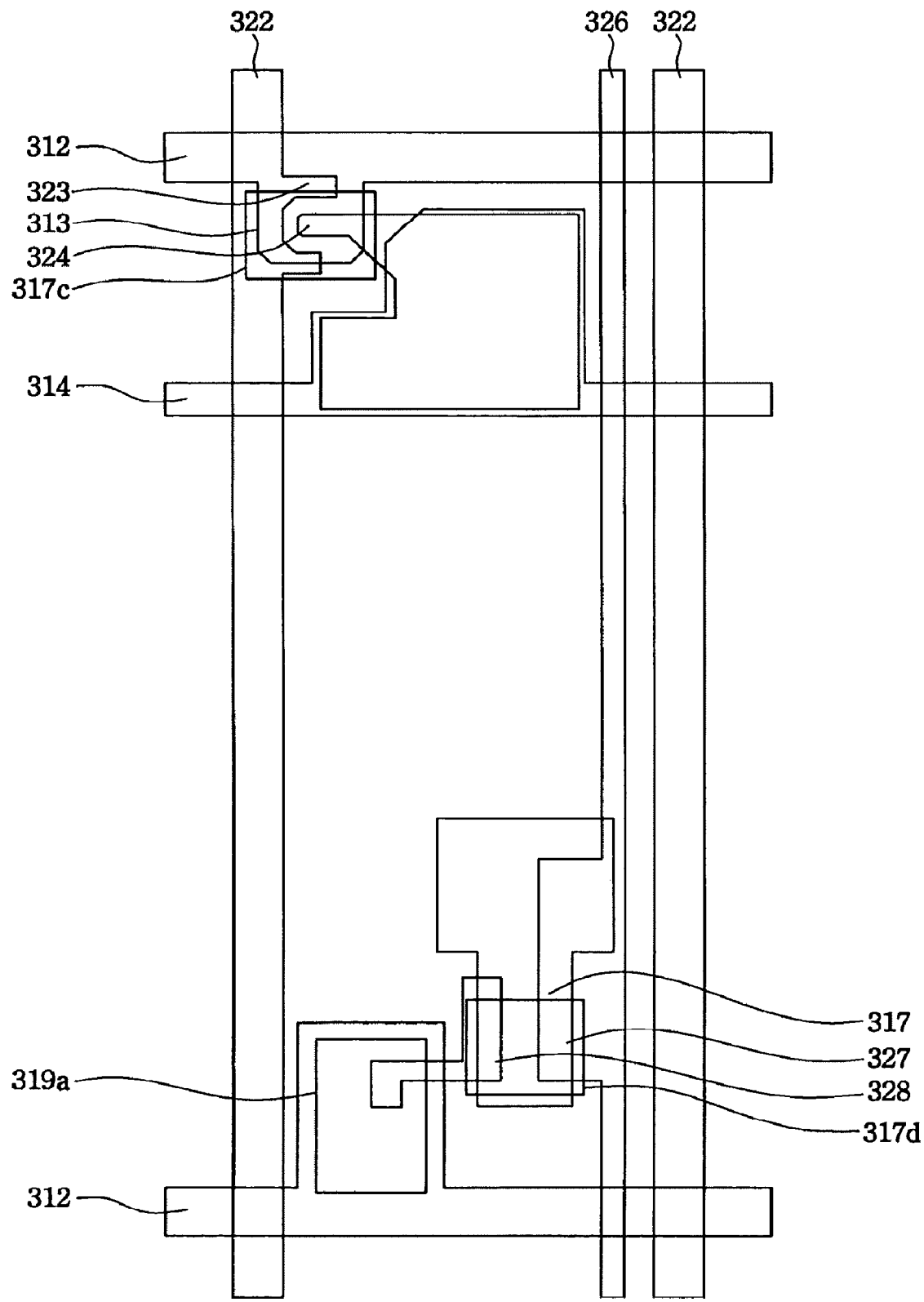

Referring to FIG. 11B, a metal such as tantalum (Ta), titanium (Ti), molybdenum (Mo), aluminum (Al), chrome (Cr), copper (Cu), tungsten (W), or the like, is deposited on the transparent substrate having the gate insulating layer (not shown).

The deposited metal is patterned to form the data line 322, the first source electrode 323, the first drain electrode 324, the read out line 326, the second drain electrode 327 and the second source electrode 328. The first drain electrode 324 is partially overlapped with the capacitor line 314 to form the storage capacitor CST.

The data line 322 is extended in the vertical direction, and arranged in the longitudinal direction. The first source electrode 323 is electrically connected to the data line 322. The first drain electrode 324 is spaced apart from the first source electrode 323.

The read out line 326 is extended in the vertical direction, and arranged in the longitudinal direction. The second drain electrode 327 is electrically connected to the read out line 326. The second source electrode 328 is spaced apart from the second drain electrode 327, and electrically connected to the gate line 312 through the fourth hole 319a.

Figure 11C:
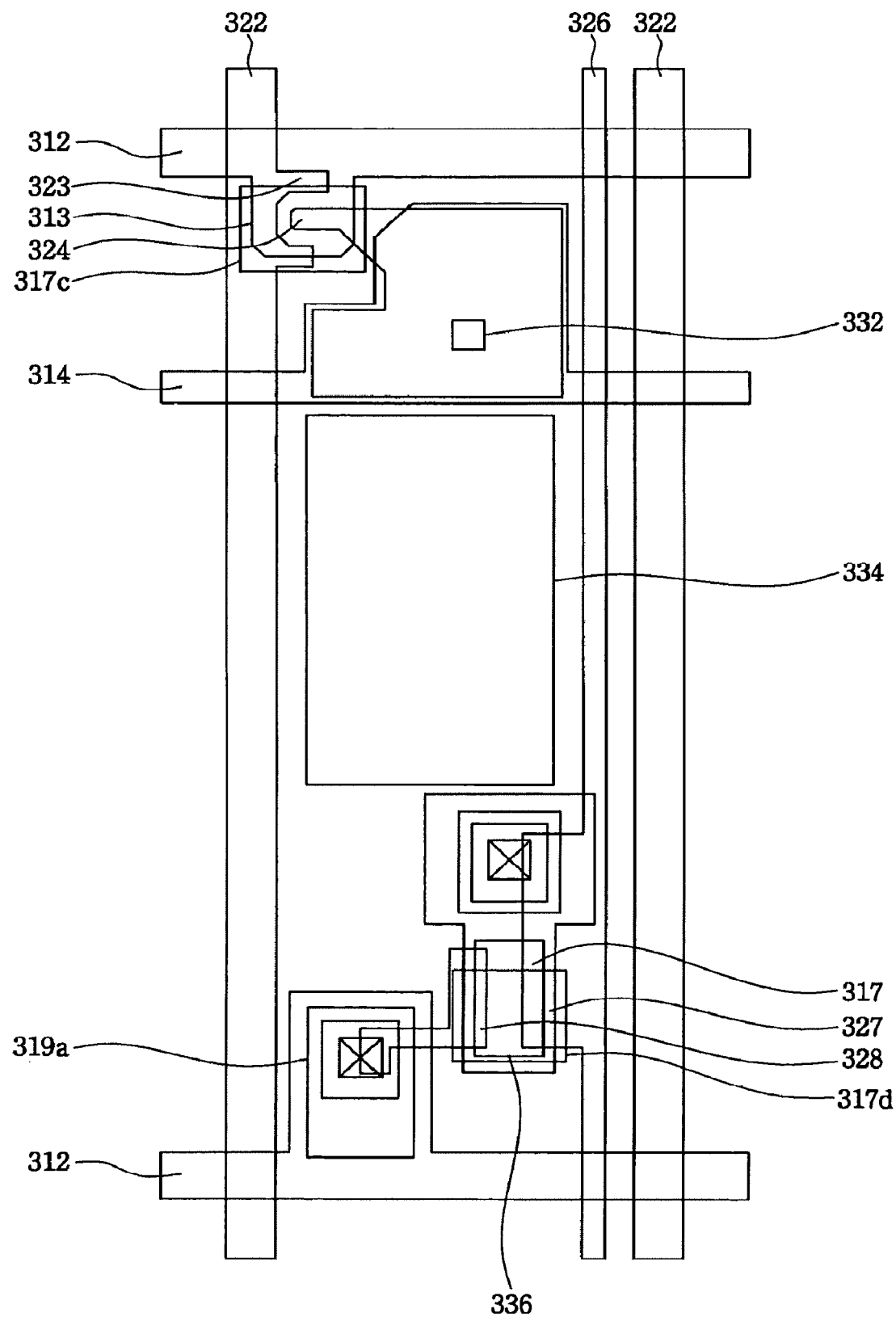

Referring to FIG. 11C, an organic material having photoresist is coated on the transparent substrate having the data line 322, the first source electrode 323, the first drain electrode 324, the read out line 326, the second drain electrode 327 and the second source electrode 328 to form an organic insulating layer (not shown). Alternatively, the organic material may be coated on the transparent substrate through a spin coating process. The organic insulating layer (not shown) corresponding to the pixel defined by the gate and data lines 312 and 322 is partially removed to form the first hole 332, the opening window 334 and the second hole 336. The first drain electrode 324 is partially exposed through the first hole 332. The transparent substrate or the gate insulating layer (not shown) is partially exposed through the opening window 334. The second active layer 317d is partially exposed through the second hole 336. The externally provided light may be incident into the second active layer 317d through the second hole 336.

Figure 11D:
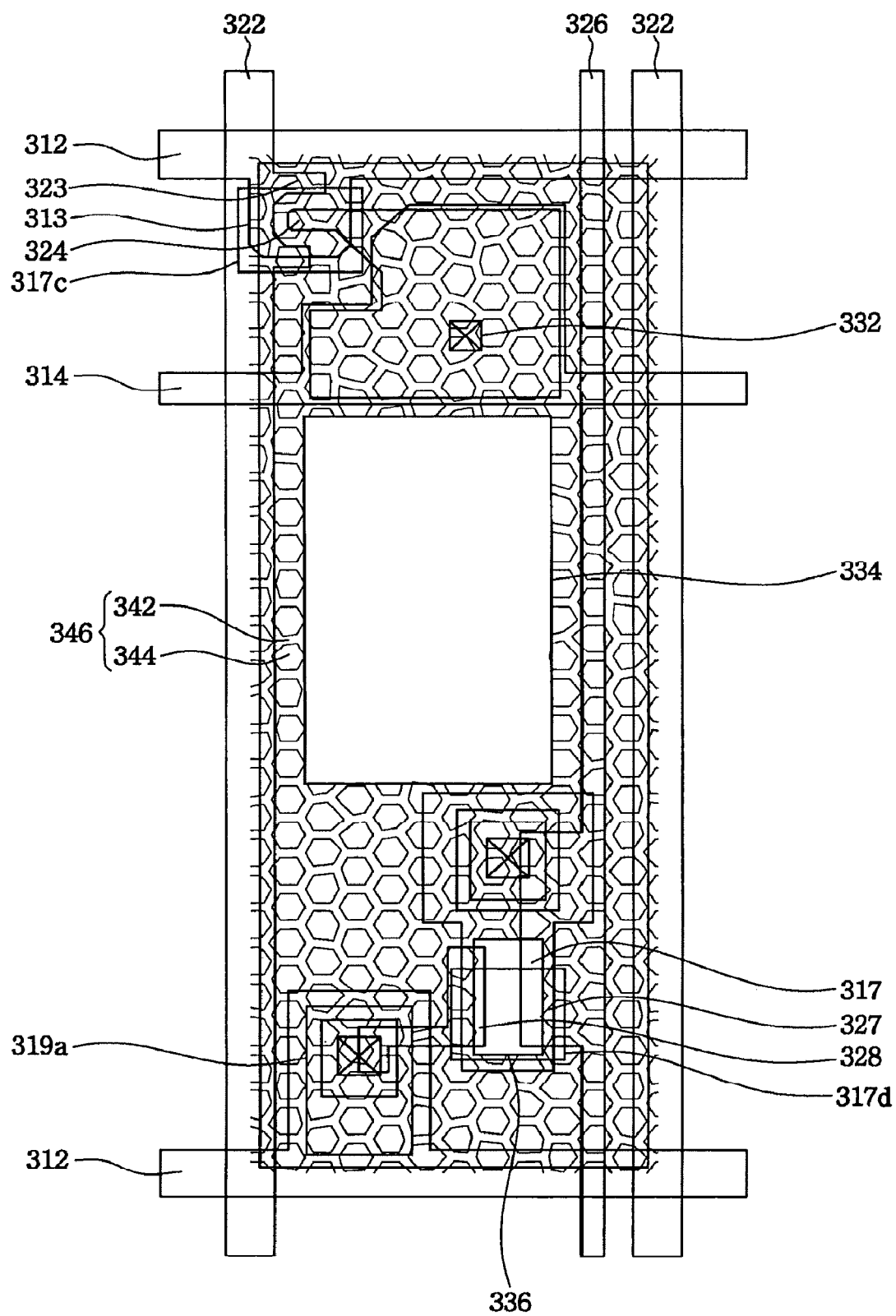

Referring to FIG. 11D, a plurality of recesses 342 and protrusions 344 is formed on the organic insulating layer (not shown) having the first hole 332, the opening window 334 and the second hole 336 so that an embossed pattern 346 is formed. A passivation layer is formed on the organic insulating layer (not shown) having the embossed pattern 346. A reflectivity of the reflection plate 370 is improved by the embossed pattern 346. Alternatively, the embossed pattern 346 may be omitted.

Figure 11E:
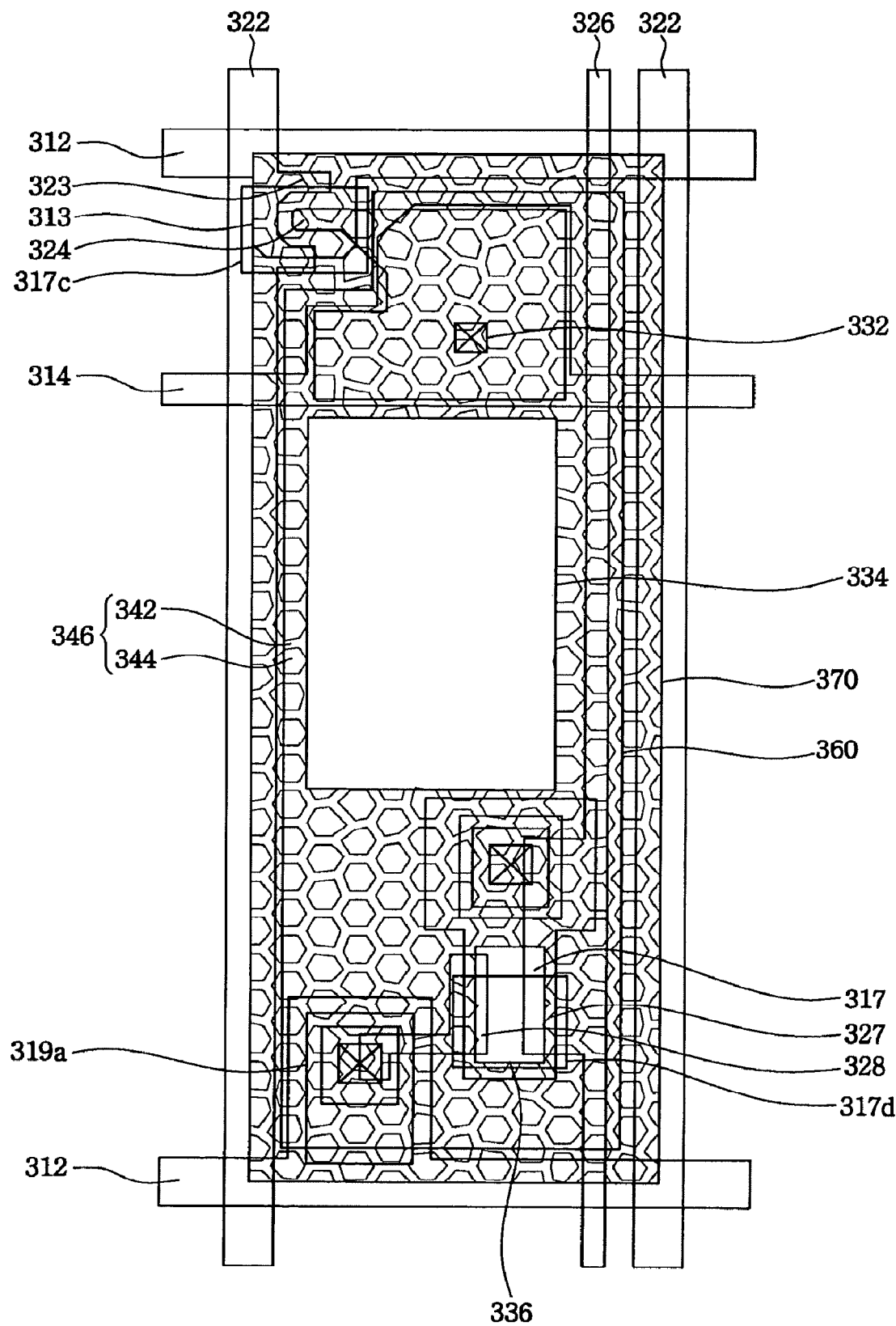

Referring to FIG. 11E, the pixel electrode 360 is formed on the passivation 10 layer. The pixel electrode 360 is electrically connected to the first drain electrode 324 through the first hole 332. The pixel electrode 360 may be formed through coating ITO on the passivation layer and patterning the coated ITO. Alternatively, the pixel electrode 360 may be formed through direct patterning. The pixel electrode 360 is spaced apart from the data line 322 and the gate line 312. Alternatively, the pixel electrode 360 may be partially overlapped with the data line 322 or the gate line 312. The reflection plate 370 is formed on a portion of the pixel electrode 360 to complete the array substrate. The reflection plate 370 defines the opening window 334. The reflection plate 370 corresponding to the second hole 336 is opened so that the externally provided light is incident into the space between the second drain electrode 327 and the second source electrode 328. An alignment layer (not shown) for aligning a liquid crystal may be formed on the reflection plate 370.

The reflection plate 370 may be formed on the organic insulating layer (not shown) corresponding to the pixel. Alternatively, the reflection plate 370 may also be formed over the whole surface of organic insulating layer (not shown).

Figure 12:
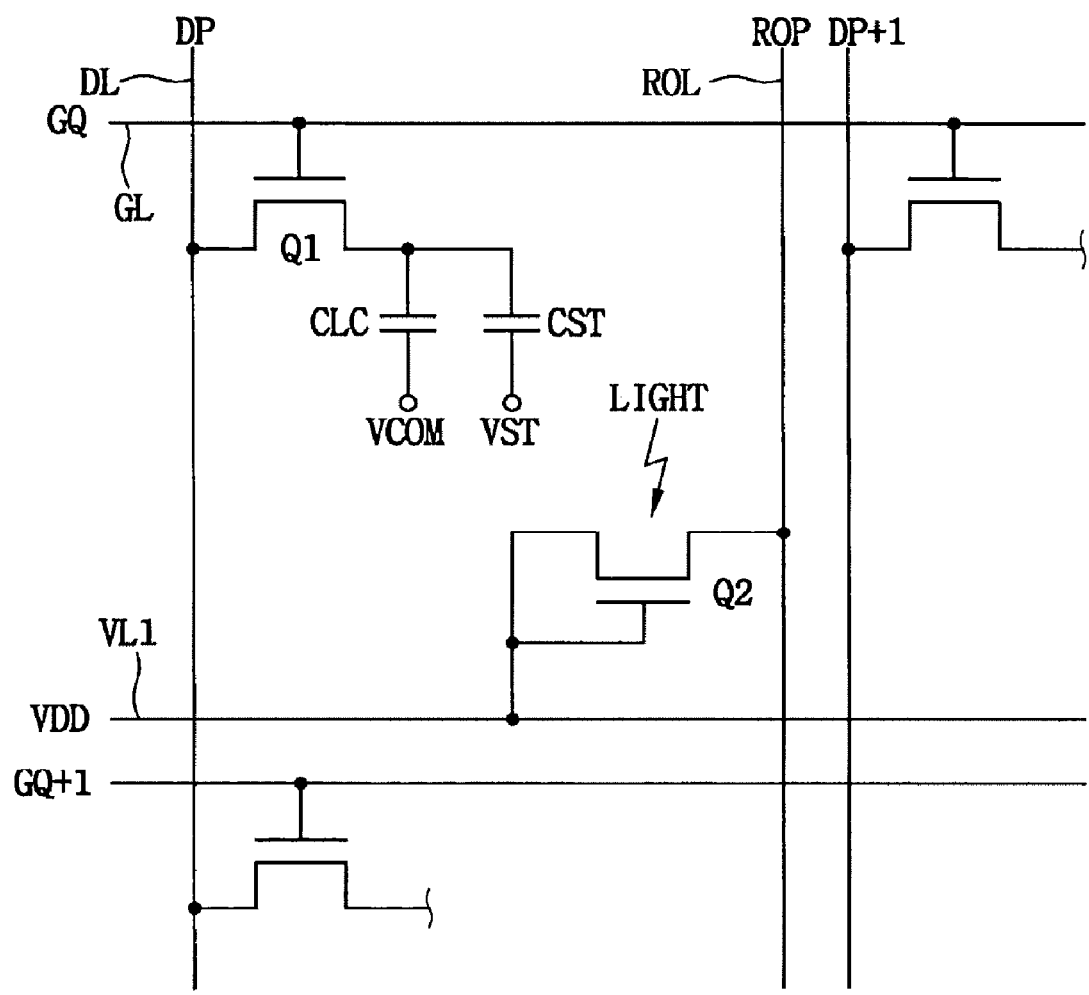

FIG. 12 is a circuit diagram showing a light sensing element according to another exemplary embodiment of the present disclosure. The light sensing element of FIG. 12 is the same as that illustrated in FIG. 2, except for a second voltage line and a second switching element. Thus, the same reference numerals are used to refer to the same or like parts as those described in connection with FIG. 2 and any further description thereof is omitted.

Referring to FIG. 12, an LCD panel having the light sensing element includes a gate line GL, a data line DL, a first switching element Q1, a liquid crystal capacitor CLC, a storage capacitor CST, a first voltage line VLI, a second switching element Q2 and a read out line ROL. The LCD panel may include a plurality of the gate lines GL, a plurality of the data lines DL, a plurality of the first switching elements Q1, a plurality of the liquid crystal capacitors CLC, a plurality of the storage capacitors CST, a plurality of the first voltage lines VL1, a plurality of the second switching elements Q2 and a plurality of the read outlines ROL.

The gate line GL is extended in a longitudinal direction, and a gate signal GO is transmitted to the first switching element Q1 through the gate line GL. The data line DL is extended in a vertical direction, and a data signal DP is transmitted to the first switching element Q1 through the data line DL.

The switching element Q1 is formed in a region defined by the gate and data lines CL and DL adjacent to one another. A source electrode of the first switching electrode Q1 is electrically connected to the data line DL, and a gate electrode of the first switching electrode is electrically connected to the gate line GL. When the gate signal GO having a high level is applied to the first switching element Q1, the first switching element Q1 is turned on so that the data signal is outputted to the liquid crystal capacitor CLC and the storage capacitor CST through a drain electrode of the first switching element Q1.

A first terminal of the liquid crystal capacitor CLC is electrically connected to the drain electrode of the first switching element Q1, and a common voltage (VCOM) is applied to a second terminal of the liquid crystal capacitor CLC. The data signal DP outputted from the drain electrode of the first switching element Q1 is stored in the liquid crystal capacitor CLC.

A first terminal of the storage capacitor CST is electrically connected to the drain electrode of the first switching element Q1. A storage voltage VST is applied to a second terminal of the storage capacitor CST. When the data signal DP outputted from the drain electrode is stored in the storage capacitor CST and the first switching element Q1 is turned off, an electric charge stored in the liquid crystal capacitor CLC is discharged so that the stored electric charge is applied to the liquid crystal capacitor CLC.

The first voltage line VL1 is extended in the longitudinal direction to apply a bias voltage VDD to the second switching element Q2. The bias voltage VDD is provided from an exterior to the light sensing element.

The second switching element Q2 is formed in a region defined by the first voltage line VL1 and the read out line ROL adjacent to one another. A source electrode of the second switching element Q2 is electrically connected to a gate electrode of the second switching element Q2 and the first voltage line VLI, and a drain electrode of the second switching element Q2 is electrically connected to the read out line ROL. When a light is incident into the second switching element Q2, a channel is formed between the source and drain electrodes of the second switching element Q2 so that a light-induced leakage current flows into the read out line ROL through the drain electrode of the second switching element Q2. The light-induced leakage current is a light sensing signal corresponding to a predetermined position on the array.

The read out line ROL is extended in the vertical direction, and outputs the light sensing signal that is the light-induced leakage current from the drain electrode of the second switching element Q2 into a driving integrated circuit (not shown).

Alternatively, the first voltage line VL1, the second switching element Q2 and the read out line ROL may be formed on an additional plate to form a pattern recognition panel. The pattern recognition panel may sense a fingerprint. A touch panel may include the pattern recognition panel.

In accordance with the present disclosure, an LCD panel may include a plurality of the light sensing elements. The LCD may be a transmissive LCD, a reflective LCD or a reflective-transmissive LCD. The LCD panel includes one switching element for sensing the light corresponding to one pixel so that the structure of the LCD panel is simplified and the opening ratio is increased.

In addition, the number of elements in each pixel is decreased so that the yield of the LCD panels is increased and potential signal interference is decreased.

The presently claimed disclosure has been described with reference to some exemplary embodiments. It should be evident, however, that many alternative modifications and variations will be apparent to those having skill in the art in light of the foregoing description. Accordingly, the present disclosure embraces all such alternative modifications and variations as fall within the spirit and scope of the appended claims and their functional equivalents.

What is claimed is:

1. A light sensing element, comprising:
a first voltage line transmitting a bias voltage;
a second voltage line transmitting an off level voltage;
a read out line for conducting a light-induced leakage current away from the light sensing element; and,
a light sensing thin film transistor comprising:
a source electrode electrically connected to the first voltage line to receive the bias voltage;
a gate electrode electrically connected to the second voltage line to receive the off voltage; and,
a drain electrode electrically connected to the read out line to output the light-induced leakage current.

2. The light sensing element of claim 1, wherein the bias voltage alternates between about −7.5V and about +15V.

3. An array substrate, comprising:
a transparent substrate;
a gate line disposed on the transparent substrate to transmit a gate signal;
a data line disposed on the transparent substrate to transmit a data signal;
a first voltage line transmitting a bias voltage;
a second voltage line transmitting an off level voltage;
a read out line for conducting a light-induced leakage current;
a switching element formed in a region defined by the gate and data lines, the switching element including a first source electrode electrically connected to the data line and a first gate electrode electrically connected to the gate line and;
a light sensing element formed in a region defined by the first and second voltage lines and the read out line, the light sensing element including a second source electrode electrically connected to the first voltage line to receive the bias voltage, a second gate electrode electrically connected to the second voltage line to receive the off voltage, and a second drain electrode electrically connected to the read out line to output the light-induced leakage current to the read out line.

4. The array substrate of claim 3, wherein the bias voltage alternates between about −7.5V and about +15V.

5. The array substrate of claim 3, further comprising a reflection plate that defines a reflection region reflecting a natural light and an opening window transmitting an artificial light, wherein the read out line and the light sensing element are disposed in the reflection region.

6. The array substrate of claim 3, further comprising a read out integrated circuit electrically connected to an end portion of the read out line, the read out integrated circuit generating position information based on the light-induced leakage current.

7. The array substrate of claim 6, further comprising an amplifier disposed between the read out line and the read out integrated circuit.

* * * * *